United States Patent
Akiyama et al.

(10) Patent No.: US 8,492,805 B2
(45) Date of Patent: Jul. 23, 2013

(54) SOLID-STATE IMAGING DEVICE, MANUFACTURING METHOD THEREOF, ELECTRONIC APPARATUS, AND SEMICONDUCTOR DEVICE

(75) Inventors: Kentaro Akiyama, Kanagawa (JP); Masaaki Takizawa, Kanagawa (JP)

(73) Assignee: Sony Corporation (JP)

( * ) Notice: Subject to any disclaimer, the term of this patent is extended or adjusted under 35 U.S.C. 154(b) by 274 days.

(21) Appl. No.: 13/010,937

(22) Filed: Jan. 21, 2011

(65) Prior Publication Data
US 2011/0186917 A1 Aug. 4, 2011

(30) Foreign Application Priority Data
Jan. 29, 2010 (JP) ................................. 2010-018577

(51) Int. Cl.
*H01L 27/14* (2006.01)
(52) U.S. Cl.
USPC ..... 257/291; 257/292; 257/620; 257/E27.133

(58) Field of Classification Search
USPC ............................ 257/291, 292, 620, E27.133
See application file for complete search history.

(56) References Cited

U.S. PATENT DOCUMENTS

| 7,948,039 | B2 * | 5/2011 | Tsutsue et al. | 257/409 |
| 8,354,735 | B2 * | 1/2013 | Lee et al. | 257/620 |
| 2007/0158788 | A1 * | 7/2007 | Yang | 257/620 |
| 2010/0025824 | A1 * | 2/2010 | Chen et al. | 257/620 |

FOREIGN PATENT DOCUMENTS

| JP | 2003-031785 A | 1/2003 |
| JP | 2005-150463 A | 6/2005 |
| JP | 2005-268238 A | 9/2005 |
| JP | 2005-285814 A | 10/2005 |
| JP | 2008-182142 A | 8/2008 |

* cited by examiner

*Primary Examiner* — Minh-Loan T Tran
(74) *Attorney, Agent, or Firm* — Sheridan Ross P.C.

(57) ABSTRACT

A semiconductor device includes a substrate, a region including a semiconductor element on the substrate, and at least one guard ring structure provided around the region. The guard ring structure includes a guard ring and at least one portion comprised of the substrate.

22 Claims, 17 Drawing Sheets

US 8,492,805 B2

SOLID-STATE IMAGING DEVICE, MANUFACTURING METHOD THEREOF, ELECTRONIC APPARATUS, AND SEMICONDUCTOR DEVICE

RELATED APPLICATION DATA

The present application claims priority to Japanese Priority Patent Application JP 2010-018577 filed in the Japan Patent Office on Jan. 29, 2010, which is incorporated herein by reference in its entirety to the extent permitted by law.

BACKGROUND OF THE INVENTION

The present invention relates to a solid-state imaging device, a manufacturing method thereof, an electronic apparatus, and a semiconductor device.

Electronic apparatuses, such as digital video cameras and digital still cameras, include a solid-state imaging device. For example, the solid-state imaging device includes a CMOS (Complementary Metal Oxide Semiconductor) image sensor and a CCD (Charge Coupled Device) image sensor.

In the solid-state imaging device, a plurality of pixels is arranged on the surface of the semiconductor substrate. Each pixel is provided with a photoelectric converter unit. The photoelectric converter unit is, for example, a photodiode which receives the light incident on a light-receiving surface through an external optical system and generates a signal charge by photoelectrically converting it.

Among the solid-state imaging devices, the pixels of the CMOS sensor are configured with a pixel transistor in addition to the photoelectric converter unit. The pixel transistor is adapted to read the signal charge generated from the photoelectric converter unit and output it to the signal line as an electric signal.

In the solid-state imaging device, generally, a photoelectric converter unit receives the light incident from the surface side of the semiconductor substrate where a circuit or interconnect is provided. In this case, it may be difficult to improve sensitivity because the circuit or interconnect blocks or reflects the incident light.

For this reason, a "rear illuminated type" is proposed, in which the photoelectric converter unit receives the light incident from the rear surface opposite to the surface where the circuit, interconnect, or the like of the semiconductor substrate is provided. (e.g., refer to Japanese Patent Application Unexamined Publication Nos. 2003-31785, 2005-150463, 2005-268238, 2005-285814, and 2008-182142)

In such a rear illuminated type, in order to receive the light incident from the rear surface with high sensitivity, a photodiode is provided on a thin-filmed semiconductor substrate.

In order to manufacture a semiconductor device such as the aforementioned solid-state imaging device, a plurality of chips is formed to be arranged side by side on a semiconductor substrate (wafer). Then, the chips are divided by dicing them using a blade along a scribe line located around the chips.

In the dicing process, the divided chips may suffer from chipping such as cracks or exfoliation, and it may degrade product yield.

SUMMARY OF THE INVENTION

Disclosed herein are one or more embodiments that are capable of improving product yield during the manufacture of semiconductor substrate devices and obtaining a high manufacturing efficiency.

For example, in order to prevent chipping, it is envisaged that a guard ring made of a material that differs from the semiconductor substrate in properties such as hardness is formed to surround the chips. As an illustrative example with respect to a solid-state imaging device, in order to prevent chipping in an interconnect layer having a metal interconnect electrically connected to each pixel within the insulation layer, the guard ring is formed as an anti-chipping portion within the interconnect layer. For example, the guard ring is formed using a metal material through a manufacturing process similar to that of the metal interconnect.

In addition, in order to prevent chipping in the semiconductor substrate having a photodiode, the guard ring is formed as an anti-chipping portion within the semiconductor substrate. Particularly, in the "rear illuminated type" solid-state imaging device, the semiconductor substrate where the chips are provided is thin. Therefore, a guard ring may be formed such that it continuously surrounds the entire circumference of the chip in a ring shape and it passes through the semiconductor substrate in the depth direction.

However, in this case, the inventors recognize that since the chip, which is surrounded by the guard ring, has a floating state in the electrical sense, electric charges generated in the chip during a subsequent manufacturing process are not evacuated but accumulated. Therefore, due to the accumulated electric charges, it may be difficult to manufacture the chips as desired, and thus, there may be problems such as degradation of product yield. For example, properties such as a manufacturing feature, a film formation amount, exfoliation during cleaning vary significantly from a target value, and the aforementioned problems may become remarkable. In this manner, since the product yield is degraded due to chipping, it may be difficult to manufacture the semiconductor device such as a solid-state imaging device with high manufacturing efficiency.

According to an embodiment of the invention, a semiconductor element such as a solid-state imaging device having a pixel area in which the pixel including the photoelectric converter unit is formed is provided in the chip area on the surface of the semiconductor substrate. In addition, the scribe area is formed on the surface of the semiconductor substrate to surround the circumference of the chip area. In the semiconductor substrate, the guard ring is formed of a material different from that of the semiconductor substrate in the inner side of the chip area side than the portion diced in the scribe area. Therefore, the guard ring prevents chipping from propagating from the scribe area to the chip area during the dicing. The guard ring has at least one "slit" (or at least one portion comprised of the substrate). The electric charges accumulated in the inner portion surrounded by the guard ring on the surface of the semiconductor substrate can be evacuated from the inner portion to the outer portion through the slit.

According to an embodiment, a solid-state imaging device includes a substrate, a pixel region on the substrate, and at least one guard ring structure provided around the pixel region. The pixel region includes a plurality of pixels. Each pixel includes a photoelectric conversion unit. The guard ring structure includes a guard ring and at least one portion comprised of the substrate.

According to an embodiment, a method for manufacturing a solid-state imaging device includes forming at least one guard ring structure. To form the guard ring structure, at least one trench is formed in a portion of a substrate, where a guard ring is to be formed. The trench is filled with a material to form the guard ring. The material of the guard ring is different from a material of the substrate. The method further includes dicing the substrate around the at least one guard ring structure. At the time of dicing, the at least one guard ring structure includes the guard ring and at least one portion comprised of the substrate.

According to an embodiment, an electronic apparatus includes a solid-state imaging device. The solid-state imaging device includes a substrate, a pixel region on the substrate, and at least one guard ring structure provided around the pixel region. The pixel region includes a plurality of pixels. Each pixel includes a photoelectric conversion unit. The guard ring structure includes a guard ring and at least one portion comprised of the substrate.

According to an embodiment, a semiconductor device includes a substrate, a region including a semiconductor element on the substrate, and at least one guard ring structure provided around the region. The guard ring structure includes a guard ring and at least one portion comprised of the substrate.

Embodiments, such as the solid-state imaging device, the method for manufacturing a solid-state imaging device, the electronic apparatus, and the semiconductor device improve product yield and obtain a high manufacturing efficiency.

DESCRIPTION OF THE PRESENTLY PREFERRED EMBODIMENTS

The embodiments of the invention will now be described with reference to the accompanying drawings.

The descriptions will be provided in the following sequence.

1. First Embodiment (a single guard ring+at least one slit on the surface of the substrate)
2. Second Embodiment (two guard rings+at least one slit on the surface of the substrate)
3. Third Embodiment (a single guard ring+a slit in the depth direction of the substrate)
4. Others 1. First Embodiment (1) Configuration of Device (1-1) Configuration of Main Elements of Camera FIG. 1 is a block diagram illustrating a configuration of the camera 40 according to a first embodiment of the invention.

Figure 1:
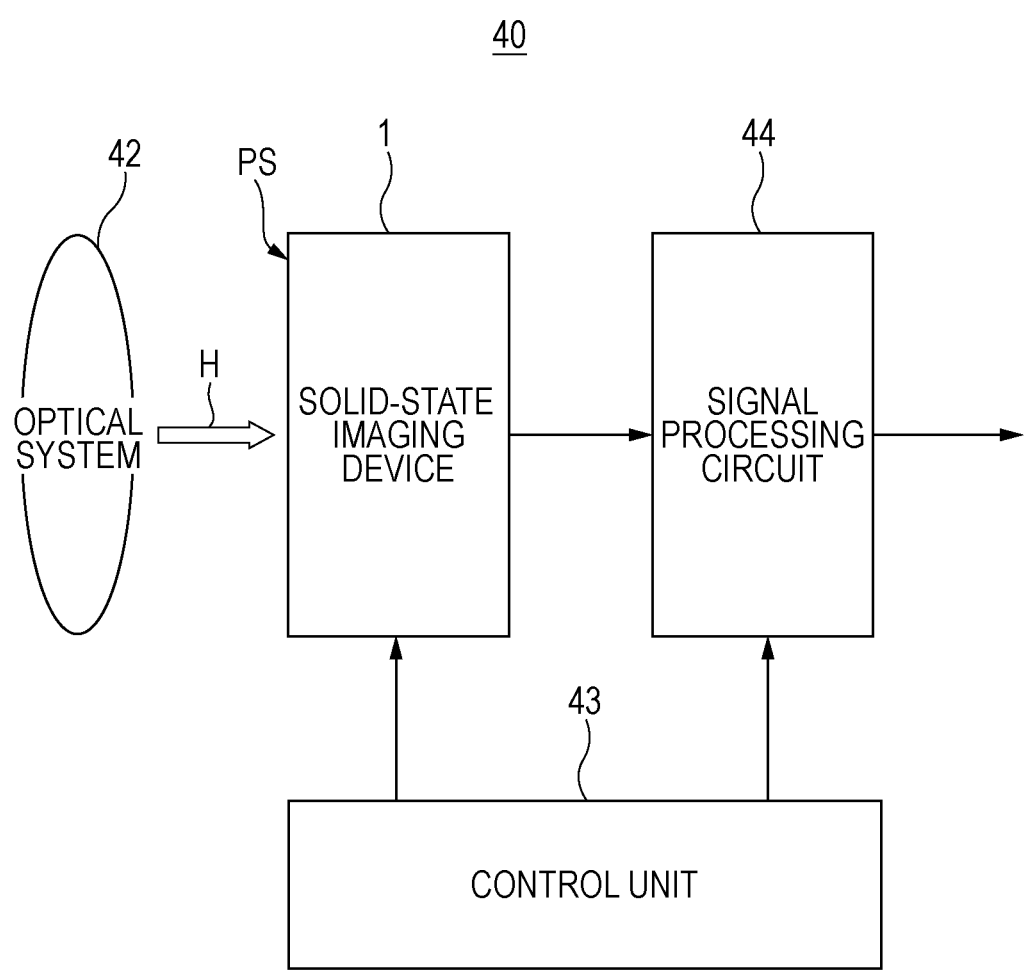
FIG. 1 is a block diagram illustrating a configuration of a camera according to a first embodiment of the invention.

Referring to FIG. 1, the camera 40 includes a solid-state imaging device 1, an optical system 42, a control unit 43, and a signal processing circuit 44, each of which will be described in sequence below.

The solid-state imaging device 1 generates a signal charge by receiving the light (subject image) incident through an optical system 42 from the imaging area PS and photoelectrically converting it. In this case, the solid-state imaging device 1 is driven based on the control signal output from the control unit 43. Specifically, the signal charge is read and output as raw data.

The optical system 42 includes optical elements such as an imaging lens or diaphragm and is arranged to focus the light H of the subject image on the imaging area PS of the solid-state imaging device 1.

The control unit 43 outputs various control signals to the solid-state imaging device 1 and the signal processing circuit 44 to control and drive the solid-state imaging device 1 and the signal processing circuit 44.

The signal processing circuit 44 is configured to generate a digital image for the subject image by performing signal processing for the electric signals output from the solid-state imaging device 1.

(1-2) Overall Configuration of Solid-state Imaging Device

The overall configuration of the solid-state imaging device 1 will now be described.

Figure 2:
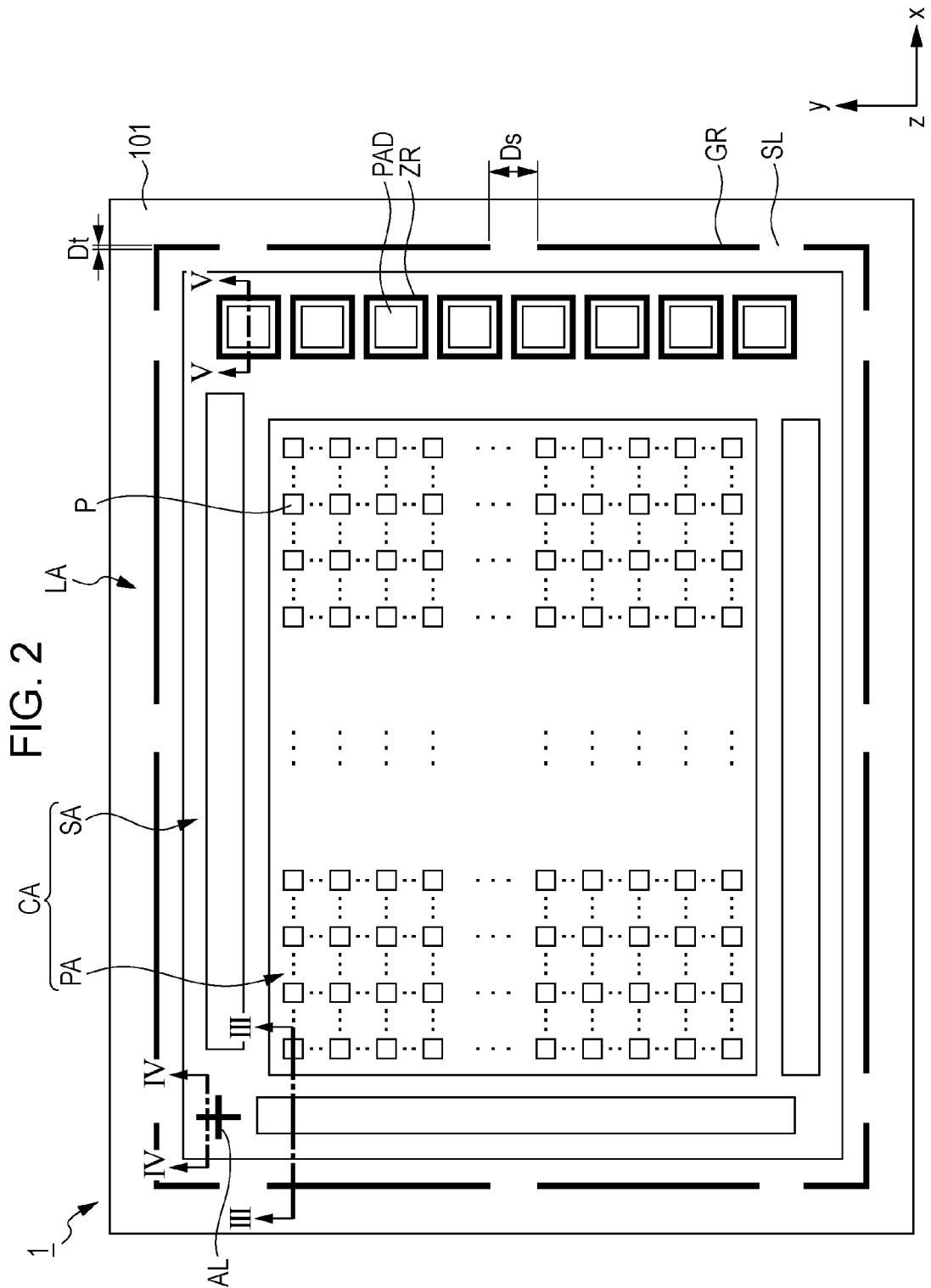
FIG. 2 is a top plan view illustrating an overall configuration of a solid-state imaging device according to a first embodiment of the invention.

FIG. 2 is a top plan view illustrating the overall configuration of the solid-state imaging device 1 according to a first embodiment of the invention.

The solid-state imaging device 1 of the present embodiment is a CMOS image sensor and includes a semiconductor substrate 101 as shown in FIG. 2. The semiconductor substrate 101 is made of, for example, silicon and includes a chip area CA and scribe area LA on the surface (X-Y surface) of the semiconductor substrate 101 as shown in FIG. 2.

The chip area CA has a rectangular shape partitioned in the horizontal direction X and the vertical direction Y as shown in FIG. 2 and includes a pixel area PA and a surrounding area SA.

In the chip area CA, the pixel area PA has a rectangular shape as shown in FIG. 2, on which a plurality of pixels P are arranged side by side in the horizontal and vertical directions X and Y. That is, the pixels P are arranged in a matrix shape.

Each of the pixels P provided in the pixel area PA is configured to receive incident light and generate signal charges. Then, the generated signal charges are read and output by the pixel transistor (not shown). The configuration of the pixel P will be described in detail below.

In the chip area CA, the surrounding area SA is located near the pixel area PA as shown in FIG. 2.

In the surrounding area SA, an alignment mark AL is provided in the upper left region, as shown in FIG. 2. The alignment mark AL is formed to include a straight line extending in the X-direction and a straight line extending in the Y-direction that perpendicularly intersect with each other. That is, the alignment mark AL is formed in a crisscross shape.

In the surrounding area SA, a plurality of pads PAD are provided in an area, which is located on one side of SA (e.g., right side). The pad PAD includes an electrode obtained by exposing the surface. The pad PAD is provided with an insulation ring ZR to surround the circumference thereof.

In addition, a peripheral circuit is provided in the surrounding area SA.

Although not shown in the drawings, the peripheral circuit includes electronic circuits such as a vertical driving circuit, a column circuit, a horizontal driving circuit, an external output circuit, a timing generator TG, and a shutter driving circuit.

The vertical driving circuit is provided on the left side of the pixel area PA in the surrounding area SA and is configured to selectively drive the pixels P of the pixel area PA on a row-by-row basis.

In the surrounding area SA, the column circuit is provided at a low region of the pixel area PA and processes the signals output from the pixels P on a column-by-column basis. It is noted that the column circuit includes a correlated double sampling (CDS) circuit (not shown) and performs signal processing to remove fixed pattern noises.

In the surrounding area SA, the horizontal driving circuit is provided at a low region of the column circuit. The horizontal driving circuit includes a shift register and is configured to sequentially output the signals stored for each of the columns of the pixels P in the column circuit to the external output circuit.

In the surrounding area SA, the external output circuit is electrically connected to the column circuit to perform signal processing for the signals output from the column circuit and output the result to an external unit. The external output circuit includes, for example, an automatic gain control (AGC) circuit and an ADC circuit so that the AGC circuit applies a gain to the AGC signal, and then, the ADC circuit converts from the analog signal to the digital signal and outputs the result to an external unit.

The shutter driving circuit is configured to select the pixels P on a row-by-row basis and adjust the exposure time for the pixels P.

In the surrounding area SA, the timing generator is electrically connected to the vertical driving circuit, the column circuit, the horizontal driving circuit, the external output circuit, and the shutter driving circuit. The timing generator generates various timing signals and outputs them to the vertical driving circuit, the column circuit, the horizontal driving circuit, the external output circuit, and the shutter driving circuit to perform driving control for each part.

The scribe area LA is located to surround the circumference of the chip area CA on the surface (X-Y surface) of the semiconductor substrate 101 as shown in FIG. 2. Here, the scribe area LA includes a portion extending in the horizontal direction X and a portion extending in the vertical direction Y and is formed to have a rectangular shape around the chip area CA.

Although described below in detail, the semiconductor substrate 101 before the dicing includes a plurality of chip areas CA arranged side by side, and the scribe area LA extends in a line shape between the plurality of the chip areas CA. Dicing is performed by putting a blade to the scribe area LA so as to be divided into the solid-state imaging device 1 having the chip area CA.

The scribe area LA is provided with a guard ring structure, which includes guard ring GR and slit SL, as shown in FIG. 2. The guard ring GR is provided to prevent chipping from propagating to the chip area CA.

In the scribe area LA, the guard ring structure is provided to surround the circumference of the chip area CA in a rectangular shape at the inner portion of the chip area CA from the end divided through the dicing as shown in FIG. 2.

In the present embodiment, the guard ring GR is partially provided with the slit SL as shown in FIG. 2.

Specifically, the guard ring GR includes a portion extending in the X-direction. In the portion extending in the X-direction, silts SL are provided in a portion located in the center of the chip area CA and in portions located at or near both ends in the X-direction.

In addition, the guard ring GR includes a portion extending in the Y-direction. In the portion extending in the Y-direction, slits SL are provided in a portion located in the center of the chip area CA and a portion located at or near both ends in the Y-direction.

A detailed configuration of the guard ring GR will be described below in detail.

(1-3) Detailed Configuration of Solid-State Imaging Device

A detailed configuration of the solid-state imaging device according to the present embodiment will now be described.

FIGS. 3 to 6 illustrate main elements of the solid-state imaging device according to a first embodiment of the invention.

Figure 3:
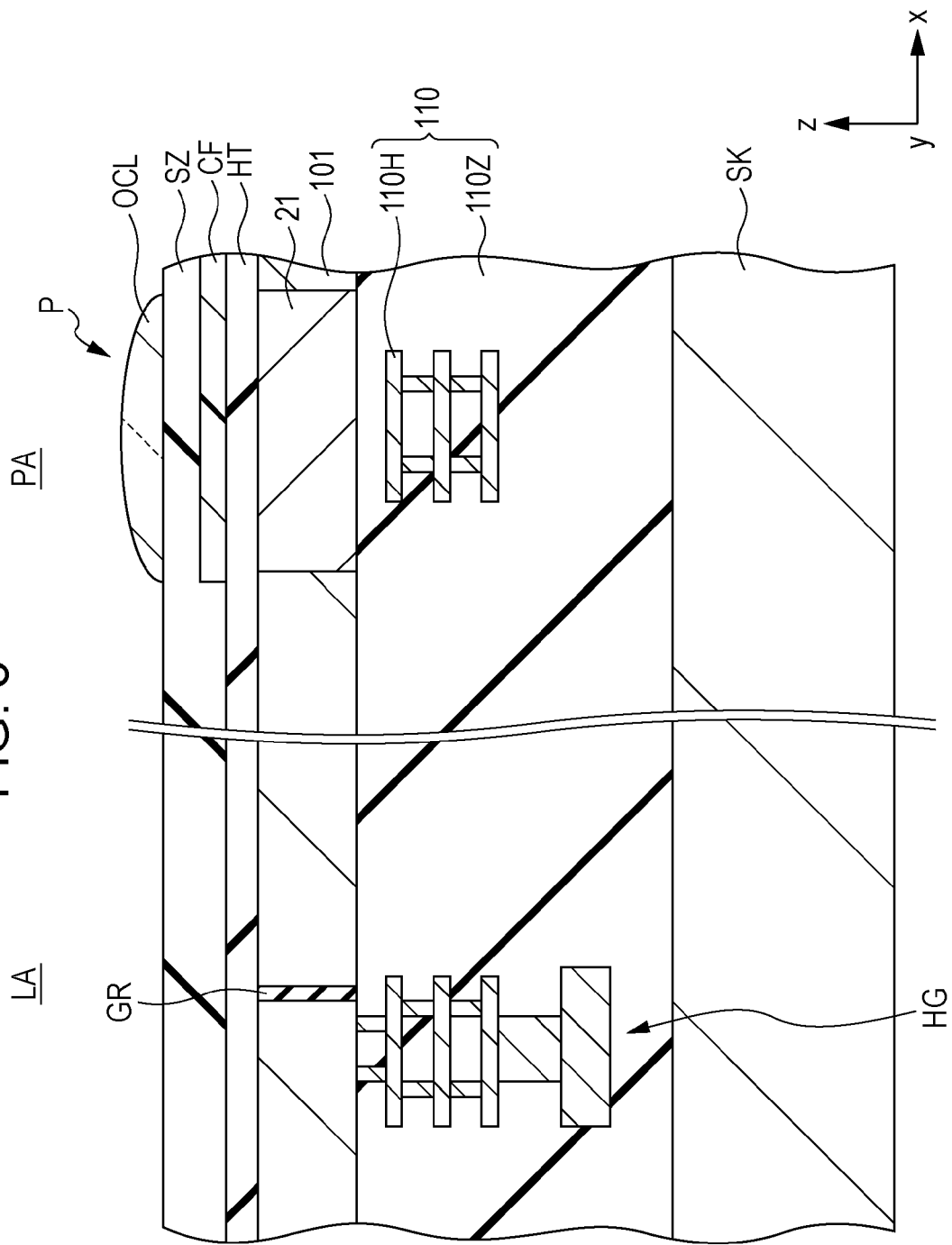
FIG. 3 is a diagram illustrating main elements of a solid-state imaging device according to a first embodiment of the invention.
Figure 4:
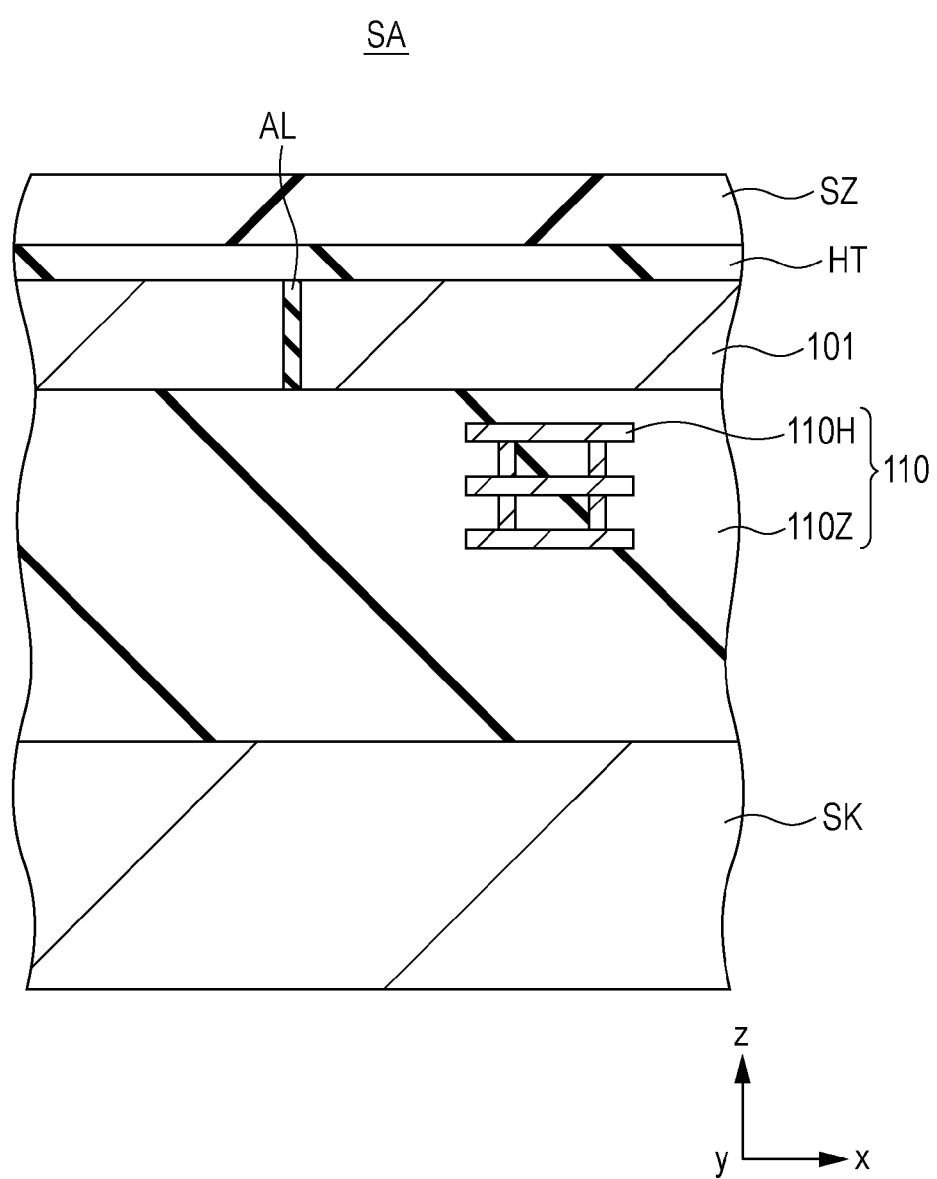
FIG. 4 is a diagram illustrating main elements of a solid-state imaging device according to a first embodiment of the invention.
Figure 5:
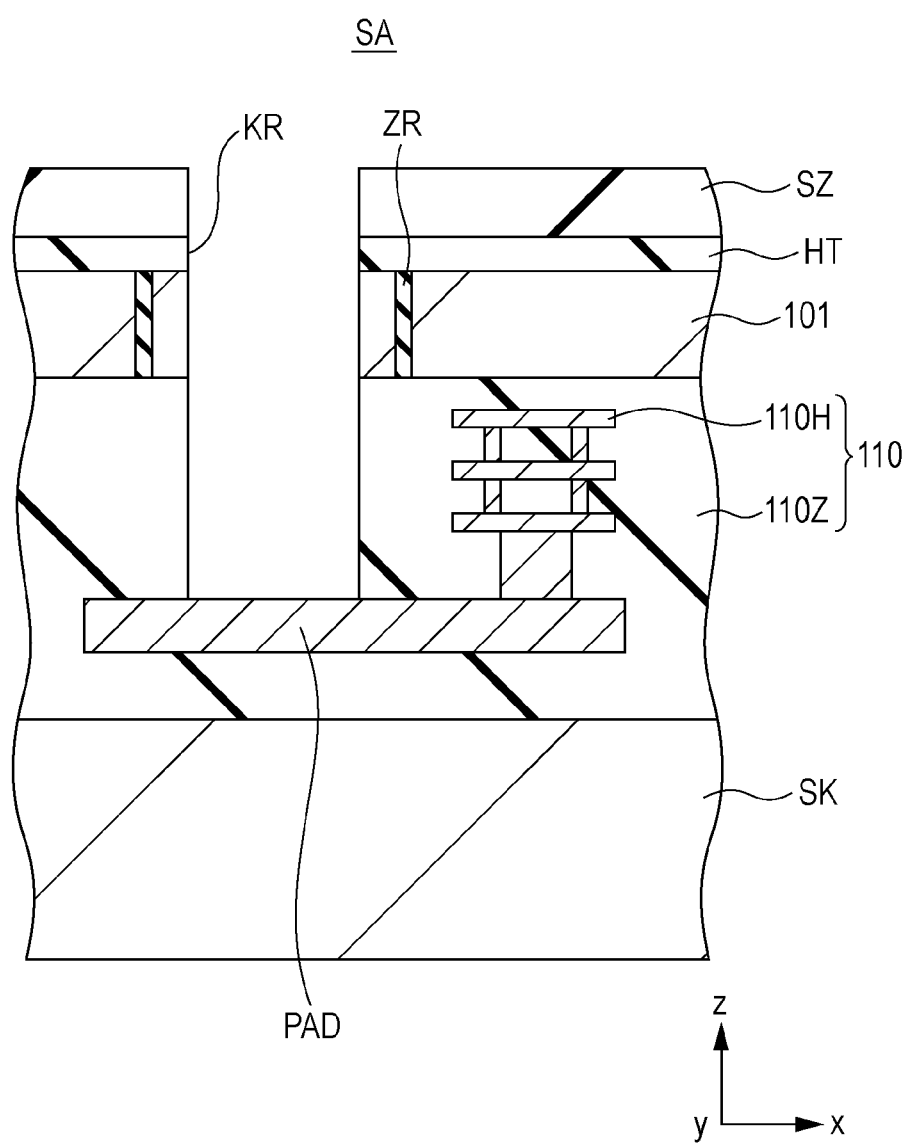
FIG. 5 is a diagram illustrating main elements of a solid-state imaging device according to a first embodiment of the invention.
Figure 6:
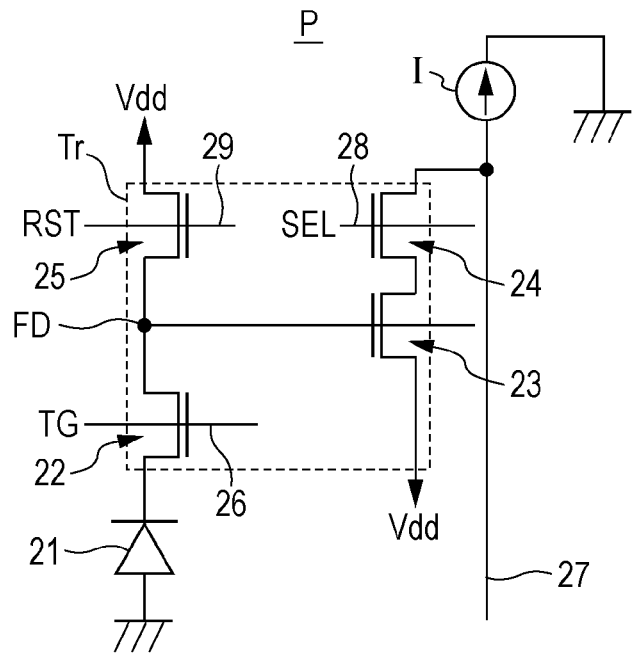
FIG. 6 is a diagram illustrating main elements of a solid-state imaging device according to a first embodiment of the invention.

It is noted that FIG. 3 illustrates a cross-section taken along the line III-III of FIG. 2, FIG. 4 illustrates a cross-section taken along the line IV-IV of FIG. 2, FIG. 5 illustrates a cross-section taken along the line V-V of FIG. 2, and FIG. 6 is a circuit diagram of the pixel P.

In the solid-state imaging device 1, the pixel P is provided in the pixel area PA, and the photodiode 21 is formed to correspond to the pixel P as shown in FIG. 3. That is, a plurality of photodiodes 21 are arranged to correspond to a plurality of the pixels P of FIG. 2 and arranged side by side in the horizontal direction X and the vertical direction Y perpendicular to the horizontal direction X on the imaging area (X-Y surface).

As shown in FIG. 3, a guard ring structure including guard ring HG with at least one slit is formed within the interconnect layer in addition to the guard ring GR in the scribe area LA. As shown in FIGS. 4 and 5, the alignment mark AL, the pad PAD, and the insulation ring ZR are formed in the surrounding area SA.

In addition, as shown in FIG. 6, the pixel transistor Tr is provided to correspond to the pixel P. Here, the pixel transistor Tr includes a transmission transistor 22, an amplification transistor 23, a selection transistor 24, and a reset transistor 25 as shown in FIG. 6 and is configured to read the signal charges from the photodiode 21. Although the pixel transistor Tr is not shown in FIG. 3, it is provided on the surface (lower surface) of the semiconductor substrate 101.

The interconnect layer 110 is provided to cover the pixel transistor Tr (not shown in FIG. 3) on the surface (lower surface) of the semiconductor substrate 101. The photodiode 21 receives the light H incident from the rear surface (upper surface) opposite to the surface.

That is, the solid-state imaging device 1 of the present embodiment is a rear illuminated type CMOS image sensor (i.e., a backside illuminated type device) having 4 transistors Tr.

Each part of the solid-state imaging device 1 will be sequentially described.

(A) Pixel Area PA of Chip Area CA

In pixel area PA, the photodiode 21 of the pixel P receives the incident light (of the subject image) and photoelectrically converts it to generate and accumulate signal charges.

Here, the photodiode 21 is provided in the semiconductor substrate 101 such as a silicon semiconductor as shown in FIG. 3. For example, the photodiode 21 is provided in the thin-filmed semiconductor substrate 101 as a semiconductor layer having a thickness of 1 to 30 μm.

Although not shown in the drawings, the photodiode 21 includes, for example, an n-type charge accumulation area (not shown), and the n-type charge accumulation area (not shown) is provided in the p-type semiconductor area (not shown) of the semiconductor substrate 101. In the n-type charge accumulation area, the p-type semiconductor area (not shown) having a high impurity concentration is provided on the surface side of the semiconductor substrate 101 as a hole accumulation layer.

The pixel transistor Tr of the pixel P is formed to output the signal charges from the photodiode 21 as an electric signal.

Although the pixel transistor Tr is not shown in FIG. 3 as described above, it is provided on the surface (lower surface) of the semiconductor substrate 101. In each transistor 22 to 25 of the pixel transistor Tr, for example, an activation area (not shown) is formed in the area for separating the pixels P from each other in the semiconductor substrate 101, and each gate is formed of, for example, polysilicon including the n-type impurity.

In the pixel transistor Tr, the transmission transistor 22 is configured to output the signal charges generated from the photodiode 21 to the gate of the amplification transistor 23 as an electric signal. Specifically, the transmission transistor 22 is provided to be interposed between the photodiode 21 and the floating diffusion FD as shown in FIG. 6. The transmission transistor 22 transmits the signal charges accumulated in the photodiode 21 to the floating diffusion FD as an output signal when the transmission signal is given to the gate from the transmission line 26.

In the pixel transistor Tr, the amplification transistor 23 is configured to amplify the electric signal output from the transmission transistor 22 and output it. Specifically, the gate of the amplification transistor 23 is connected to the floating diffusion FD as shown in FIG. 6. In addition, the drain of the amplification transistor 23 is connected to a power electric potential supply line Vdd, and the source of the amplification transistor 23 is connected to the selection transistor 24. A constant electric current is supplied from the constant electric current source I provided in portions other than the pixel area PA, and the amplification transistor 23 is operated as a source follower when the selection transistor 24 is turned on. For this reason, in the amplification transistor 23, the output signal output from the floating diffusion FD is amplified when the selection signal is supplied to the selection transistor 24.

In the pixel transistor Tr, the selection transistor 24 is configured to output the electric signal output from the amplification transistor 23 to the vertical signal line 27 when the selection signal is input. Specifically, the gate of the selection transistor 24 is connected to the address line 28 where the selection signal is supplied as shown in FIG. 6. The selection transistor 24 is turned on and outputs the output signal amplified by the amplification transistor 23 as described above to the vertical signal line 27 when the selection signal is supplied.

In the pixel transistor Tr, the reset transistor 25 is configured to reset the gate electric potential of the amplification transistor 23. Specifically, the gate of the reset transistor 25 is connected to the reset line 29 where the reset signal is supplied as shown in FIG. 6. In addition, the drain of the reset transistor 25 is connected to the power electric potential supply line Vdd, and the source of the reset transistor 25 is connected to the floating diffusion FD. The reset transistor 25 resets the electric potential of the gate of the amplification transistor 23 to the power electric potential through the floating diffusion FD when the reset signal is supplied to the gate from the reset line 29.

Each gate of each transistor 22, 24, and 25 is connected on a row-by-row basis including a plurality of pixels P arranged in the horizontal direction X, and they are simultaneously driven for a plurality of pixels arranged on a row-by-row basis. Specifically, the gates are sequentially selected on a horizontal line (pixel row) basis in the vertical direction based on the selection signal supplied from the vertical driving circuit (not shown) described above. The transistors of each pixel P are controlled by various timing signals output from the timing generator (not shown). As a result, the output signals from each pixel P are read to the column circuit (not shown) for each column of the pixel P through the vertical signal line 27. The signal stored in the column circuit is selected by the horizontal driving circuit (not shown) and sequentially output to the external output circuit (not shown).

(B) Surrounding Area SA of Chip Area CA

In the surrounding area SA, the alignment mark AL is provided to pass through between the surface and the rear surface of the semiconductor substrate 101 as shown in FIG. 4 within the semiconductor substrate 101. The alignment mark AL is used as a mark during positioning.

The pad PAD is provided within the interconnect layer 110 in the surrounding area SA as shown in FIG. 5. The pad PAD is formed such that the pad opening area KR is formed in the upper side, and the electrode surface is exposed on the rear surface (upper surface). In addition, the pad PAD is electrically connected to the interconnect 110H.

The insulation ring ZR is provided to pass through the semiconductor substrate 101 between the surface and the rear surface of the semiconductor substrate 101 as shown in FIG. 5. The insulation ring ZR is provided to surround the side face of the pad opening area KR provided in the semiconductor substrate 101 over the electrode plane of the pad PAD.

In the pad opening area KR, the side face of the semiconductor substrate 101 is exposed. For this reason, when a conductor such as a wire bond, a gold ball, or a probe for measurement makes contact with the side face of the exposed semiconductor substrate 101, a leak current flows to the chip area CA. Therefore, the insulation ring ZR is provided to electrically insulate the exposed side portion of the pad opening area KR and the chip area CA.

(C) Scribe Area LA

Figure 14:
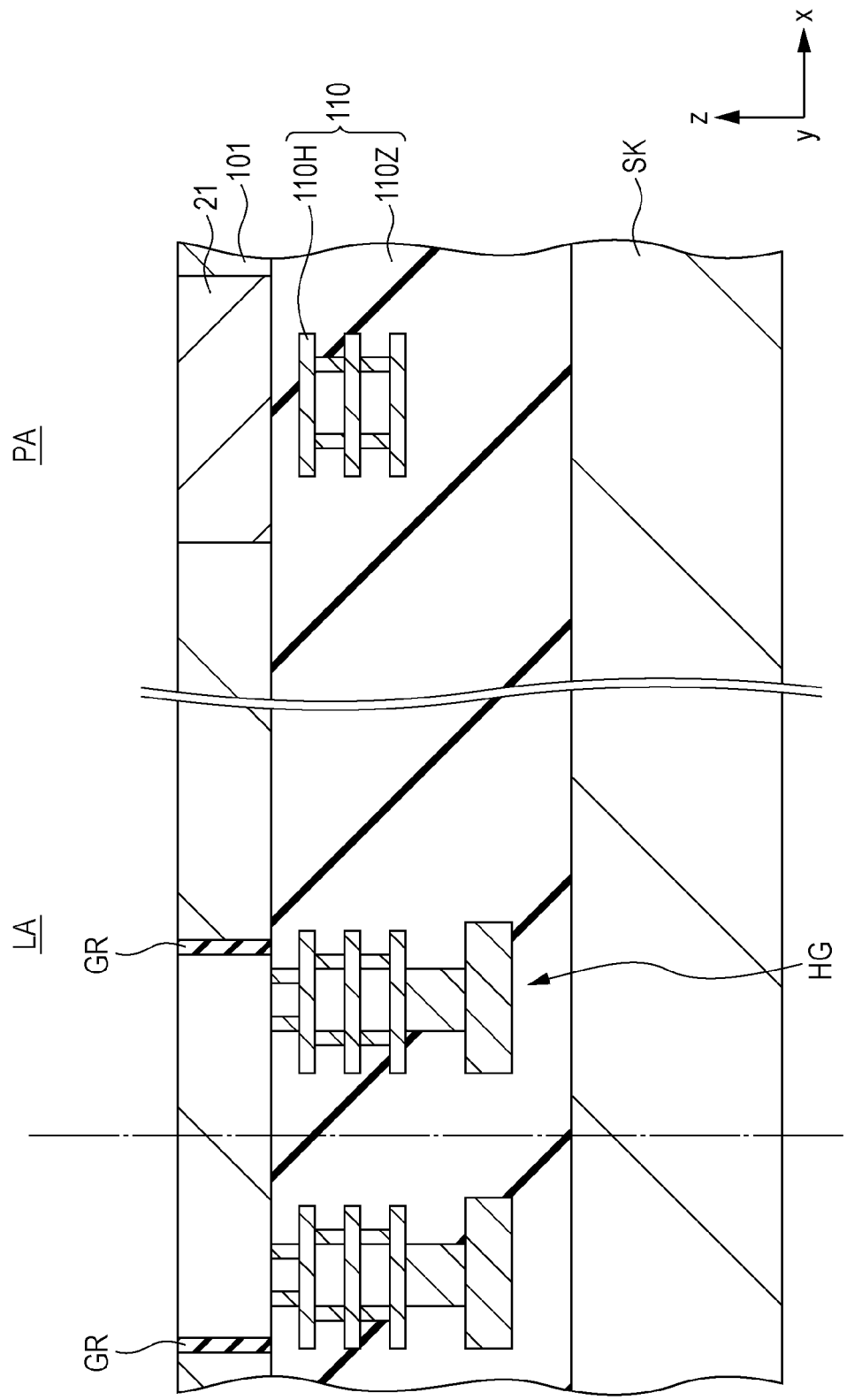
FIG. 14 is a diagram illustrating a method of manufacturing a solid-state imaging device according to a first embodiment of the invention.

In the scribe area LA, the guard ring GR is provided to pass through the semiconductor substrate 101 between the surface and the rear surface of the semiconductor substrate 101 as shown in FIG. 3. The guard ring structure may include a guard ring GR, which extends through the entire substrate in a thickness direction, as shown in FIGS. 3 and 14.

The guard ring GR is provided to prevent chipping generated inside the semiconductor substrate 101 during dicing from reaching the chip area CA. In addition, it prevents chipping generated at the interface between the semiconductor substrate 101 and the interconnect layer 110 from reaching the chip area CA.

The guard ring GR is formed of a material having properties (such as hardness or rigidity) different from those of the semiconductor substrate 101. Although described in detail below, the guard ring GR is formed by forming a trench in the portion where the guard ring GR is to be provided in the semiconductor substrate 101 and then burying a material having properties (such as hardness or rigidity) different from those of the semiconductor substrate 101 inside the trench.

In the present embodiment, the guard ring GR is formed through the same manufacturing process as that of the alignment mark AL and the insulation ring ZR. For example, it is formed by burying an insulating material such as silicon oxide ($SiO_2$) inside the trench. In addition, the guard ring GR is formed to have a horizontal width of, for example, 0.1 to 10 µm.

In addition, for example, the guard ring GR may be formed by forming a $SiO_2$ film on the side wall of the trench and then forming a polysilicon film to bury the internal side. For example, the guard ring GR may be formed by burying only a material such as SiN or SiOC inside the trench. For example, the guard ring GR may be formed by forming a film of Ti, TiN, Ta, TaN, or the like on the side wall of the trench and then forming a film of Al, Cu, W, or the like to embed the inner portion of the trench. In addition, the guard ring GR may be formed using a gas such as air in addition to a solid material such as an insulating material or a conductive material.

It is preferable that the guard ring GR is formed using a material having properties such as hardness or rigidity significantly different from those of the semiconductor substrate 101 generated due to chipping.

For example, when SiN is provided in the side wall of the trench, and the internal side thereof is embedded with polysilicon, it provides poor adhesion with the buried material at the interface. However, it is preferable that chipping propagates to the upper layer along the interface thereof. When TiN is provided in the side wall of the trench, and the internal side thereof is embedded with W, hardness of the buried material is high. Therefore, it is preferable that the chipping direction changes at the interface. In addition, when the trench is embedded with SiOC, hardness of the embedded material is low, and it is soft so that the embedded material is fractured. Therefore, it is preferable that chipping is transmitted to the upper layer.

In the scribe area LA, the guard ring HG within the interconnect layer is provided inside the interconnect layer 110. The guard ring HG within the interconnect layer is provided to prevent chipping generated within the interconnect layer 110 during the dicing from reaching the chip area CA. In addition, it is provided to prevent moisture absorption to the chip area CA from the side face.

In the present embodiment, the guard ring HG within the interconnect layer is formed, for example, through the same manufacturing process as that of the interconnect layer 110. For example, the guard ring HG is formed of a metal material such as aluminum, copper, or tungsten. The guard ring HG within the interconnect layer is formed to have a horizontal width of, for example, 3 to 20 µm.

(D) Others

In addition, a color filter CF or on-chip lens OCL is formed on the rear surface (upper surface) of the semiconductor substrate 101 to correspond to the pixel P as shown in FIG. 3.

Here, the color filter CF is provided on the rear surface (upper surface) of the semiconductor substrate 101 through the planarization film HT. The color filter CF is arranged with the filter layers with each color in a Bayer arrangement.

The on-chip lens OCL is provided on the rear surface (upper surface) of the semiconductor substrate 101 through the insulation film SZ provided to cover the color filter CF.

The interconnect layer 110 is provided on the surface (lower surface) of the semiconductor substrate 101. In the interconnect layer 110, the interconnect 110H electrically connected to each element is formed within the insulation layer 110Z. The interconnect layer 110 is formed by repeatedly stacking a plurality of interconnects and a plurality of insulation films. For example, each interconnect 110H is stacked to function as interconnects for the transmission line 26, the address line 28, the vertical signal line 27, the reset line 29, or the like shown in FIG. 6.

In addition, in the interconnect layer 110, the support substrate SK is provided on the surface (lower surface) opposite to the surface (upper surface) of the semiconductor substrate 101 side. The support substrate SK is, for example, a silicon semiconductor substrate and is bonded to the interconnect layer 110 to ensure the strength of the entire device.

(2) Manufacturing Method

Main elements of the method of manufacturing the aforementioned solid-state imaging device 1 will now be described.

FIGS. 7 to 15 are diagrams illustrating a method of manufacturing the solid-state imaging device according to a first embodiment of the invention.

Figure 7:
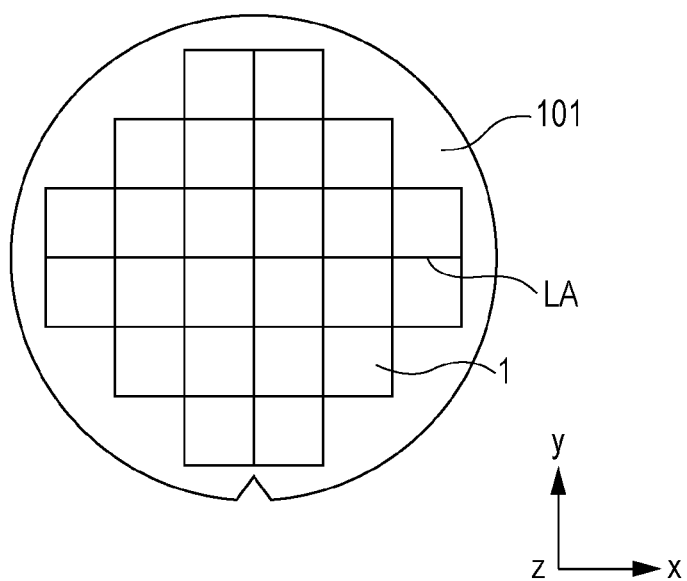
FIG. 7 is a diagram illustrating a method of manufacturing a solid-state imaging device according to a first embodiment of the invention.

Here, FIG. 7 illustrates the upper surface of the semiconductor substrate 101 before the dicing for dividing into the aforementioned solid-state imaging device 1.

Similar to FIG. 3, FIGS. 8 and 11 to 15 illustrate a cross-section taken along the lines VIII-VIII, XI-XI, and XV-XV in the right side and a cross-section of the scribe area LA of the solid-state imaging device provided near it in the semiconductor substrate 101 before dividing in the left side.

Figure 9:
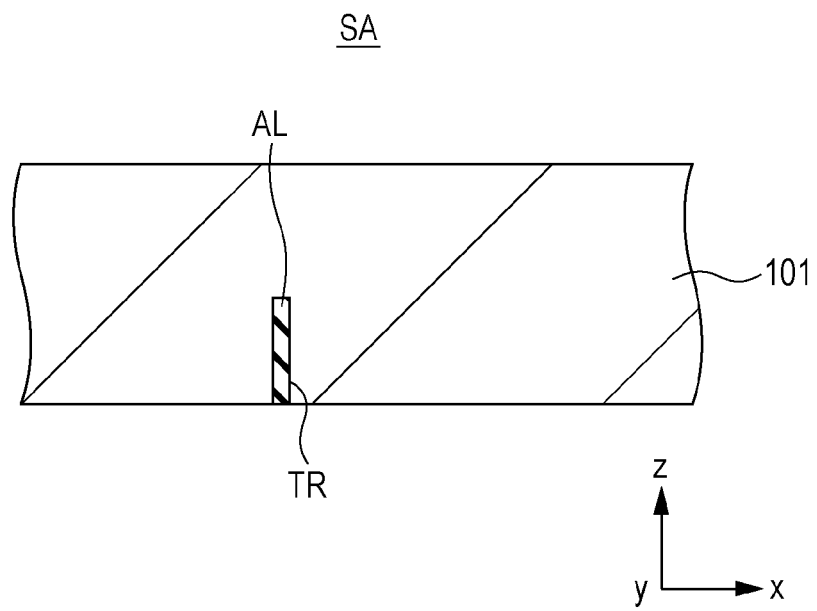
FIG. 9 is a diagram illustrating a method of manufacturing a solid-state imaging device according to a first embodiment of the invention.
Figure 10:
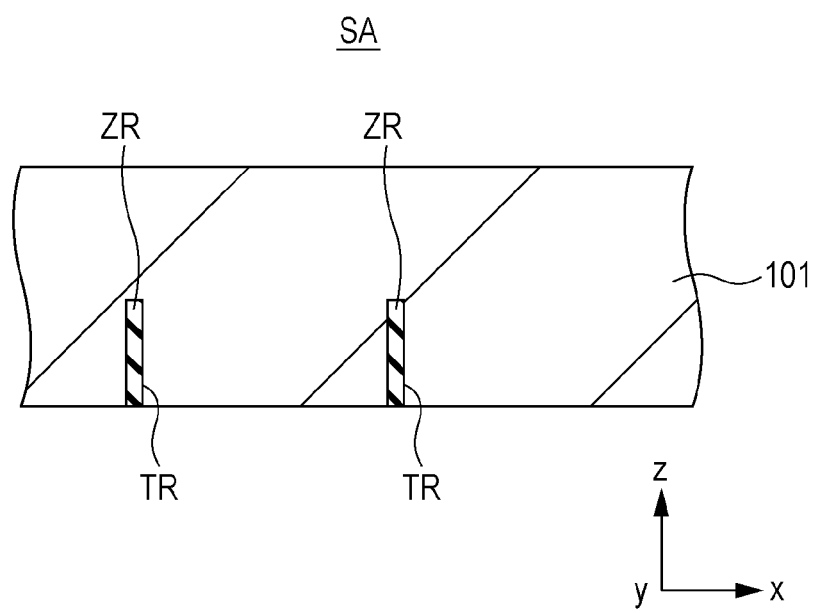
FIG. 10 is a diagram illustrating a method of manufacturing a solid-state imaging device according to a first embodiment of the invention.

Similar to FIG. 4, FIG. 9 illustrates a cross-section taken along the line IX-IX. Similar to FIG. 5, FIG. 10 illustrates a cross-section taken along the line X-X.

In the present embodiment, a plurality of solid-state imaging devices 1 are formed on the surface of the semiconductor substrate 101 having a disc shape as shown in FIG. 7. Here, a plurality of solid-state imaging devices 1 are formed through each process shown in FIGS. 8 to 15. In other words, a plurality of solid-state imaging devices 1 are provided as a semiconductor chip on the surface of the semiconductor wafer.

Then, as shown in FIG. 7, the semiconductor wafer is divided into a plurality of solid-state imaging devices 1 by performing dicing using a blade (not shown) in the scribe area LA provided in a line shape around the solid-state imaging device 1.

Hereinafter, each process of the method of manufacturing the solid-state imaging device 1 will be sequentially described.

(2-1) Formation of Guard Ring GR, Alignment Mark AL, Insulation Ring ZR
(Process 1)

Figure 8:
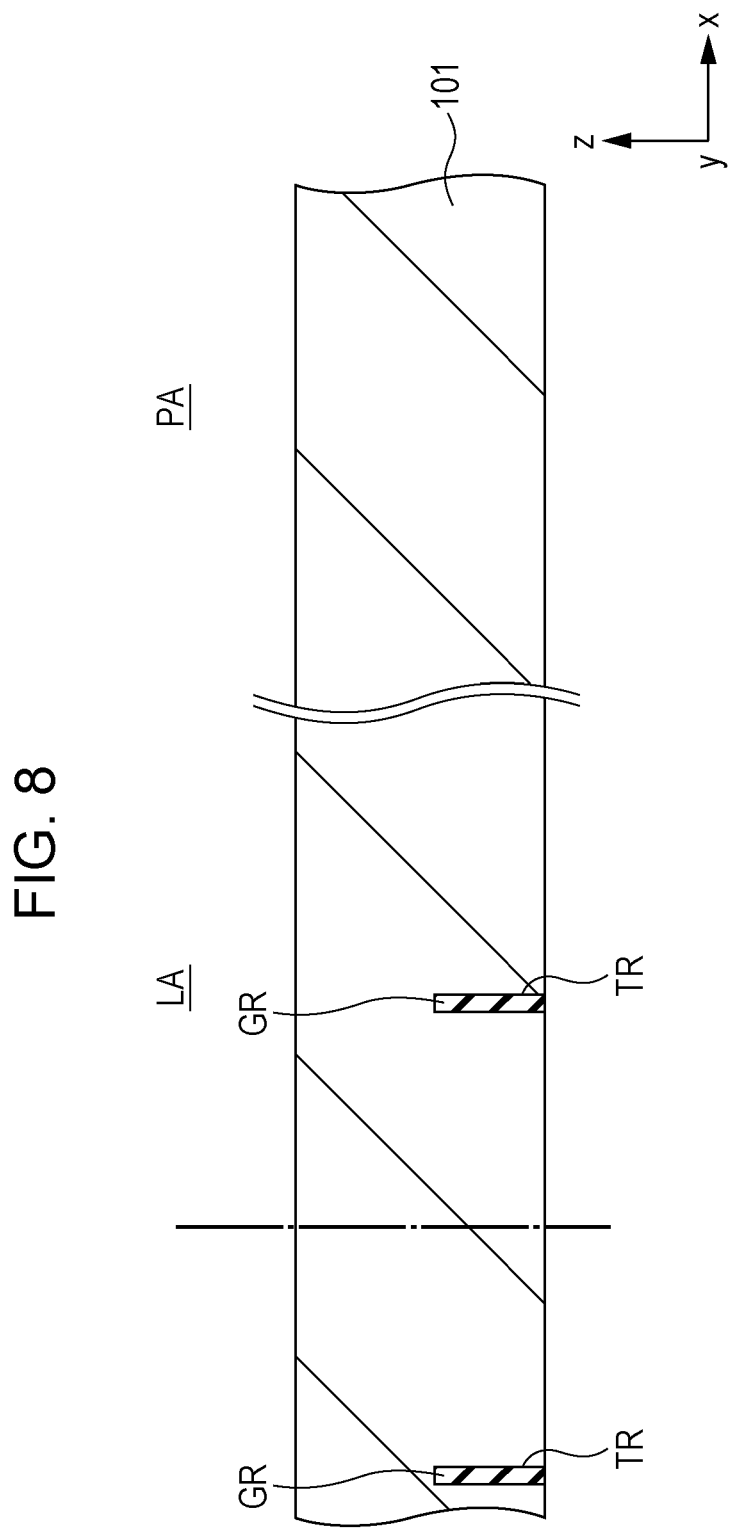
FIG. 8 is a diagram illustrating a method of manufacturing a solid-state imaging device according to a first embodiment of the invention.

First, as shown in FIGS. 8 to 10, the guard ring GR, the alignment mark AL, and the insulation ring ZR are formed on the surface side of the semiconductor substrate 101.

Here, as shown in FIG. 8, first, in the scribe area LA, the trench TR is formed in the portion where the guard ring GR is formed. In addition, as shown in FIG. 9, in the surrounding area SA, the trench TR is formed in the portion where the alignment mark AL is formed. In addition, as shown in FIG. 10, in the surrounding area SA, the trench TR is formed in the portion where the insulation ring ZR is formed.

For example, a hard mask (not shown) in which the portions forming the guard ring GR, the alignment mark AL, and the insulation ring ZR are opened is formed on the surface side (lower surface in the drawing) of the semiconductor substrate 101. For example, the hard mask is formed by patterning the silicon nitride film (not shown).

The trench TR is formed in the semiconductor substrate 101 by performing etching for the semiconductor substrate 101 using the hard mask. For example, the trench TR is formed in the semiconductor substrate 101 by etching the semiconductor substrate 101 using the RIE method.

In the present embodiment, the alignment mark AL is provided in the upper left region on the surrounding area SA as shown in FIG. 2. In the surrounding area SA, a plurality of pads PAD are provided on one side (e.g. the right side). In addition, in the scribe area LA, the guard ring GR is provided to surround the circumference of the chip area CA in the rectangular shape at the inner portion of the chip area CA from the end portion divided by the dicing as shown in FIG. 2. In addition, the slits SL are provided with respect to the guard ring GR of the guard ring structure. Slit SL may include at least one portion comprised of semiconductor substrate 101. That is, the guard ring structure includes guard ring GR and at least one portion comprised of semiconductor substrate 101, which defines a slit of the guard ring structure. For this reason, the trench TR is formed to correspond to such a shape. That is, in the semiconductor substrate 101, the trench TR is formed by removing the formation portion of the guard ring GR, and the formation portions forming the slits SL are not removed so that the trench TR is not formed.

For example, the trench TR is formed such that the width Dt of the trench TR becomes 0.1 to 100 µm.

In addition, the trench TR is formed such that the slit SL defined in the surface direction of the semiconductor substrate 101 has a width Ds of 0.1 to 100 µm.

Then, for example, the silicon oxide film (not shown) is provided on the surface of the semiconductor substrate 101 by forming a film to bury an insulating material such as silicon oxide $SiO_2$ inside the trench TR. In addition, the surface of the semiconductor substrate 101 is exposed by performing a CMP process or the like for the silicon oxide film (not shown) such that the silicon oxide remains only inside the trench TR. As a result, the guard ring GR, the alignment mark AL, and the insulation ring ZR are formed as shown in FIGS. 8 to 10.

The invention is not limited to the case where the guard ring GR, the alignment mark AL, and the insulation ring ZR are formed of silicon oxide as described above. The guard ring GR, the alignment mark AL, and the insulation ring ZR may be formed of various appropriate materials such as an insulating material or a conductive material described above.

(2-2) Formation of Photodiode 21 (Process 2)

Figure 11:
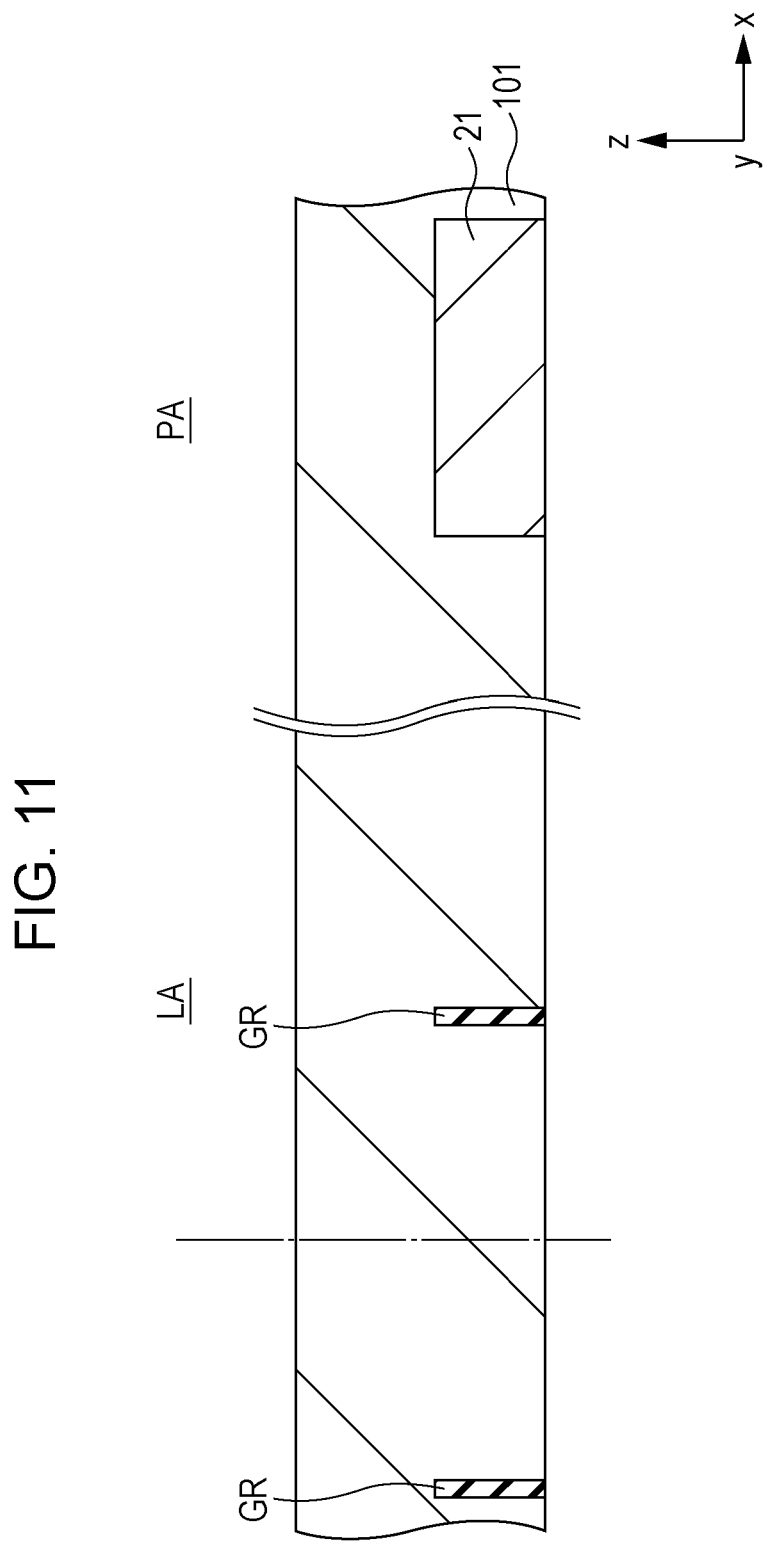
FIG. 11 is a diagram illustrating a method of manufacturing a solid-state imaging device according to a first embodiment of the invention.

Next, the photodiode 21 is formed as shown in FIG. 11.

Here, in the semiconductor substrate 101, the photodiode 21 is formed by appropriately implanting impurity ions to the portion forming the photodiode 21.

Although not shown in the drawings, the pixel transistor Tr is formed on the surface of the semiconductor substrate 101. For example, activation areas (not shown) of each transistor 22 to 25 are formed at the area for separating the pixels P in the semiconductor substrate 101. For example, gates of each transistor 22 to 25 are formed of polysilicon.

In this process diagram, since the alignment mark AL is used to perform positioning, the photodiode 21 or the like are formed to correspond to the positions of each pixel P.

(2-3) Formation of Interconnect layer 110 (Process 3)

Figure 12:
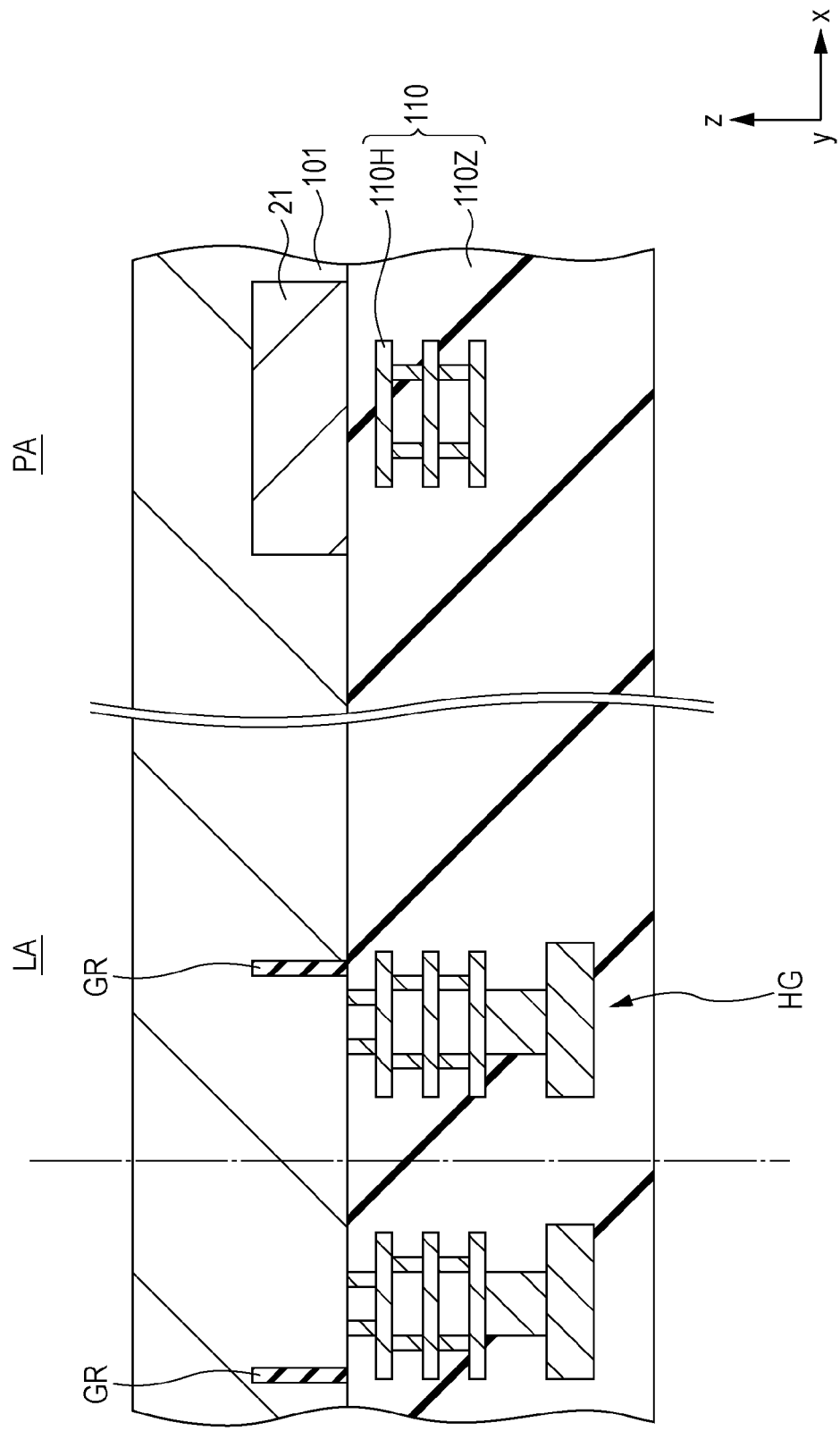
FIG. 12 is a diagram illustrating a method of manufacturing a solid-state imaging device according to a first embodiment of the invention.

Next, the interconnect layer 110 is formed as shown in FIG. 12.

Here, the interconnect layer 110 is formed on the surface (lower surface) of the semiconductor substrate 101.

For example, after forming a film of an insulating material such as silicon oxide, a metal film made of a metal material such as aluminum Al is formed thereon as a film. Then, the interconnect 110H is formed by patterning the metal film. In addition, an insulating material is formed as a film to cover the interconnect 110H. The interconnect layer 110 is formed by repeating such steps.

In the present embodiment, when the interconnect layer 110 is formed, the guard ring HG within the interconnect layer is simultaneously formed.

Specifically, a metal material is formed as a film in the portion forming the interconnect 110H, and at the same time, a metal material is also formed as a film in the portion forming the guard ring HG within the interconnect layer. Then, when the interconnect 110H is patterned, the guard ring HG within the interconnect layer is also patterned at the same time.

Although not shown in the drawings, the interconnect layer 110 is formed in each area other than the pixel area PA and the scribe area LA shown in FIG. 12 through the aforementioned process.

(2-4) Installation of Support Substrate SK (Process 4)

Figure 13:
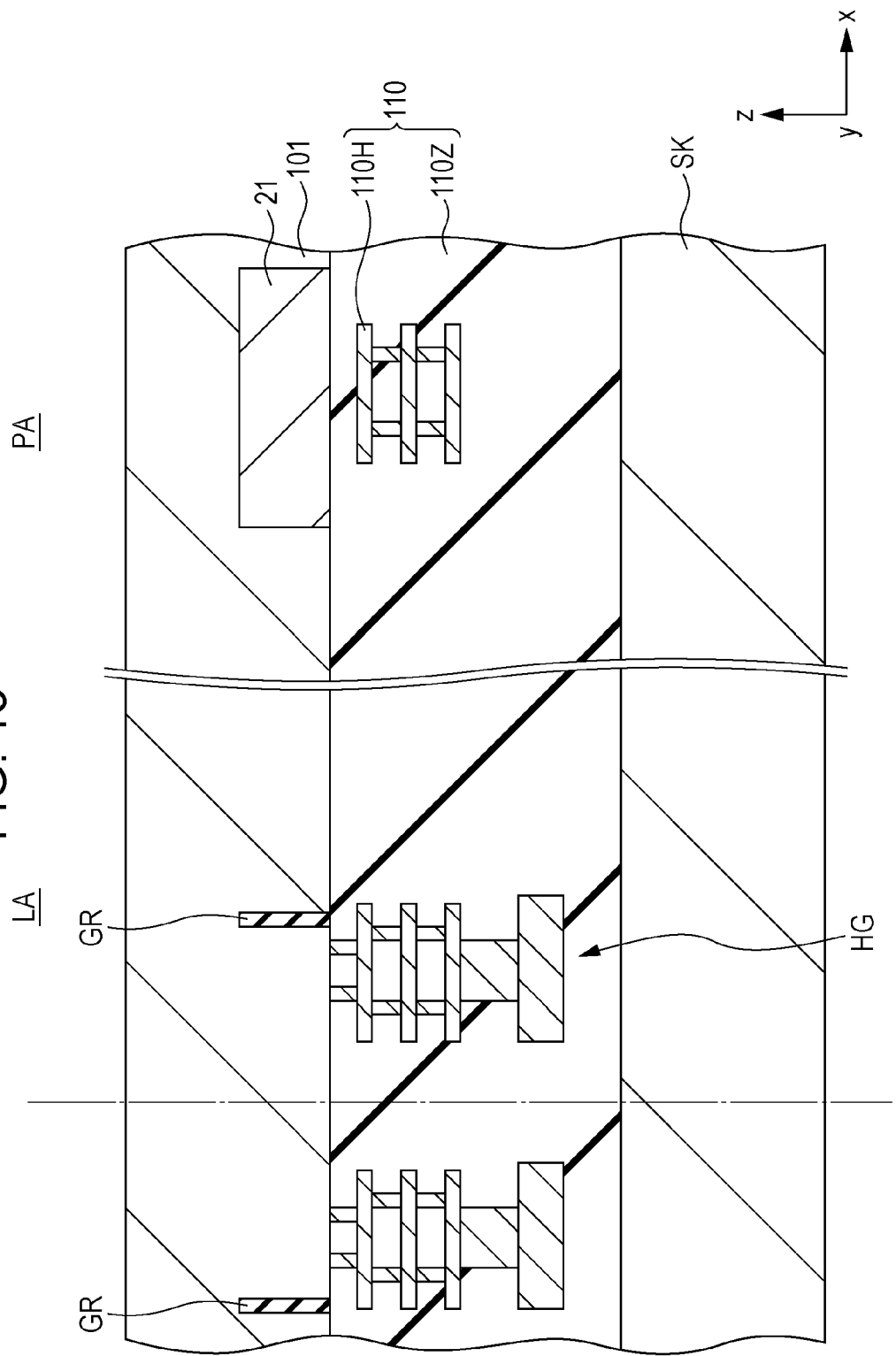
FIG. 13 is a diagram illustrating a method of manufacturing a solid-state imaging device according to a first embodiment of the invention.

Next, the support substrate SK is provided as shown in FIG. 13.

Here, in the interconnect layer 110, the support substrate SK is provided on the surface opposite to the surface in the semiconductor substrate 101 side.

For example, the support substrate SK is provided by bonding the support substrate SK, which is a silicon semiconductor substrate, to the interconnect layer 110. For example, silicon oxide is used for the bonding.

(2-5) Thinning of Semiconductor Substrate 101 (Process 5)

Next, as shown in FIG. 14, the semiconductor substrate 101 is thinned.

Here, the semiconductor substrate 101 is thinned by performing a removing process such as a CMP process for the rear surface opposite to the surface where the interconnect layer 110 is provided in the semiconductor substrate 101.

In the present embodiment, the semiconductor substrate 101 is thinned until the guard ring GR, the alignment mark AL, and the insulation ring ZR provided inside the semiconductor substrate 101 are exposed. In other words, the guard ring GR, the alignment mark AL, and the insulation ring ZR are used as a stopper for stopping the removal process such as a CMP process. As a result, the semiconductor substrate 101 is thinned to have a thickness of, for example, 1 to 30 µm.

(2-6) Formation of Color filter CF and On-chip Lens OCL (Process 6)

Figure 15:
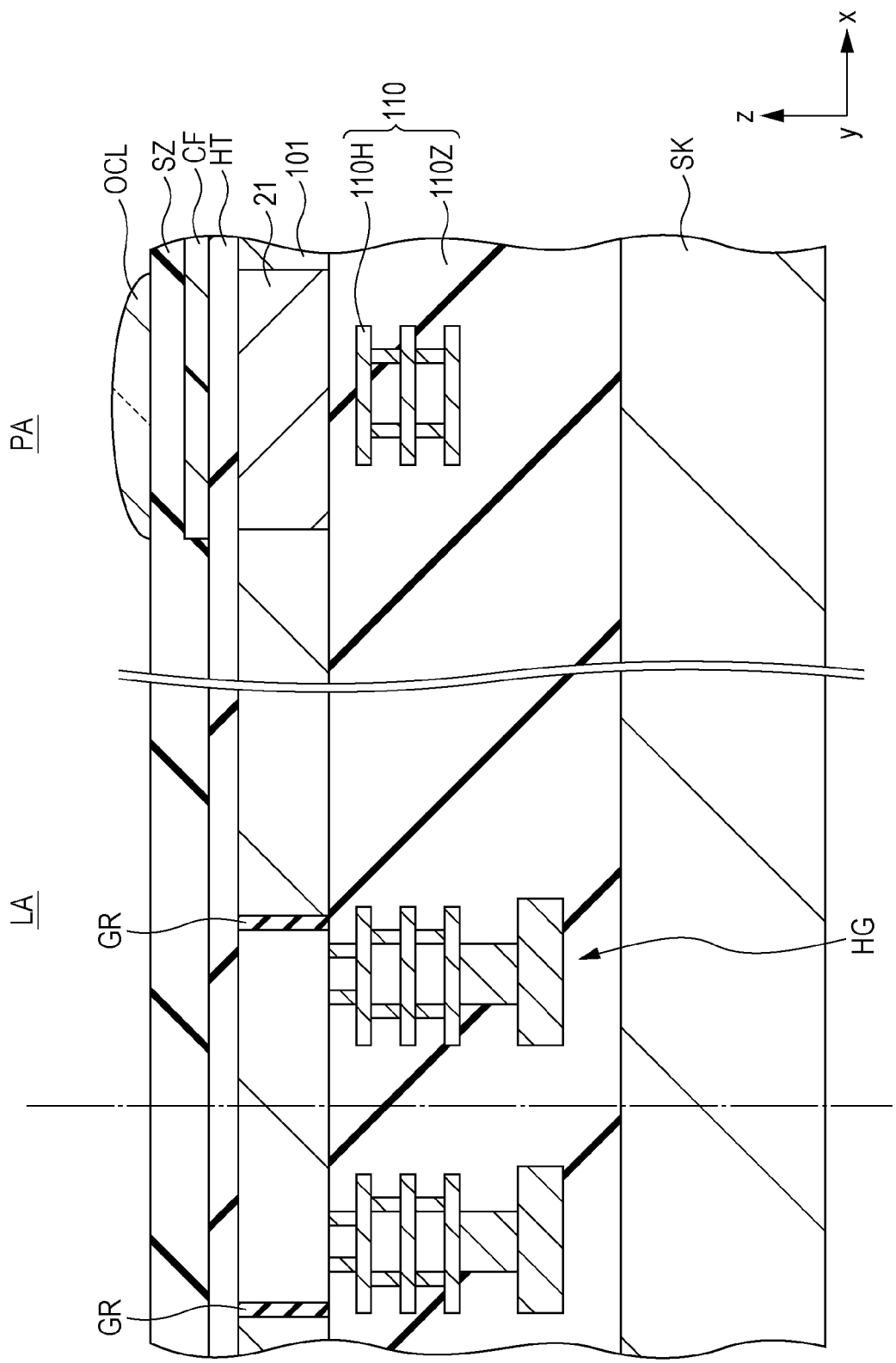
FIG. 15 is a diagram illustrating a method of manufacturing a solid-state imaging device according to a first embodiment of the invention.

Next, the color filter CF and the on-chip lens OCL are formed as shown in FIG. 15.

Here, the color filter CF and the on-chip lens OCL are sequentially provided on the rear surface (upper surface) of the thinned semiconductor substrate 101 to correspond to the pixel P.

Specifically, a planarization film HT is formed on the rear surface (upper surface) of the semiconductor substrate 101 using an insulating material, and then, the color filter CF is formed on the surface of the planarization film HT. For example, the color filter CF is formed by arranging the filter layer (not shown) with each color in a Bayer arrangement to correspond to each pixel P.

In order to form the color filter CF, a coloring layer (not shown) is formed, for example, by coating a coating liquid containing resin and pigment corresponding to each color, and then, the coloring layer is patterned through a lithographic technique so that the filter layer of each color is formed.

In addition, the insulation film SZ is provided to cover the color filter CF, and then, the on-chip lens OCL is formed on the surface of the insulation film SZ.

In order to form the on-chip lens OCL, for example, a lens material is formed as a film on the surface of the insulation film SZ to form a lens material film (not shown), and then, a photoresist film is provided on the lens material film. The photoresist film is patterned in a lens shape, and then, the etch back process is performed for the lens material film by using the resist pattern having a lens shape as a mask so that the on-chip lens OCL is formed.

As shown in FIG. 5, in the surrounding area SA, a pad opening is formed to expose the electrode surface of the pad PAD. Here, this opening is formed by performing etching for each layer provided over the pad PAD.

As a result, as shown in FIG. 7, a plurality of solid-state imaging devices 1 are formed on the surface of the semiconductor substrate 101 having a disc shape.

Then, the semiconductor substrate 101 is divided into a plurality of solid-state imaging devices 1 by performing dicing using a blade (not shown) in the scribe area LA having a line shape around a plurality of solid-state imaging devices 1 as shown in FIG. 7. That is, a plurality of solid-state imaging devices 1 are obtained as a plurality of semiconductor chips by cutting the semiconductor substrate 101.

Here, as shown in FIG. 15, the dicing is performed at the portions (shown as a one-dotted chain line) located between the guard rings GR of a plurality of the solid-state imaging devices 1 in the scribe area LA of the semiconductor substrate 101 (wafer) before the dividing.

As a result, a solid-state imaging device 1 as a rear illuminated type CMOS image sensor or a backside illuminated type device is completed.

(3) Conclusion

As described above, in the present embodiment, the chip area CA in which the pixels P including the photodiode 21 are formed in the pixel area PA and the scribe area LA surrounding the circumference of the chip area CA are provided on the surface (X-Y surface) of the semiconductor substrate 101. In addition, in the semiconductor substrate 101, the guard ring GR formed of a material different from that of the semiconductor substrate 101 is provided to surround the circumference of the chip area CA in the internal side of the chip area CA side from the portion where the dicing is performed in the scribe area LA. Therefore, the guard ring GR can be used to prevent chipping during the dicing from propagating to the chip area from the scribe area LA.

In the present embodiment, the guard ring GR is formed such that the portions other than the portion where the silts SL are provided pass through the semiconductor substrate 101 in the depth direction from one surface to the other surface (refer to FIG. 3). For this reason, it is preferable that the guard ring GR can be used to prevent chipping from propagating from the scribe area LA to the chip area CA across the entire depth of the semiconductor substrate 101.

However, when the chip area CA is perfectly surrounded by the guard ring GR, the chip area CA has an electrically floating state. Therefore, in the subsequent manufacturing process, electric charges are accumulated in the chip area CA. For example, when a film is formed through coating or etching is performed in order to form the color filter CF or the on-chip lens OCL, the chip area CA is charged so that electric charges are accumulated in the chip area CA. For this reason, due to the accumulated electric charges, it is difficult to perform manufacturing as desired so that product yield may be degraded or other problems may occur. For example, the aforementioned problems may be exhibited when properties such as a manufacturing shape, a film formation amount, exfoliation in cleaning fluctuate significantly from a target value.

In the present embodiment, in order to address such problems, the guard ring GR has the slits SL to evacuate the electric charges accumulated in the inner portion surrounded by the guard ring GR from the inner portion to the outer portion through the slits SL (refer to FIG. 2). The guard ring structure includes at least one slit SL. Slit SL may include at least portion comprised of the substrate. Slit SL is structured to allow electric charge to migrate past the guard ring GR.

Therefore, in the present embodiment, it is possible to address the aforementioned problems, improve product yield, and obtain a high manufacturing efficiency.

In the aforementioned embodiment, in the step of forming the trench TR through the process of forming the guard ring GR, the trench TR is also formed in the portions forming the alignment mark AL and the insulation ring ZR in addition to the portion forming the guard ring GR in the semiconductor substrate 101. In the film formation step during the process of forming the guard ring GR, a material different from that of the semiconductor substrate is buried in the trench TR formed in the portions forming the alignment mark AL and the insulation ring ZR in addition the trench TR of the portion forming the guard ring GR. In this manner, the guard ring GR, the alignment mark AL, and the insulation ring ZR are simultaneously formed through the same process.

Therefore, in the present embodiment, it is possible to obtain a high manufacturing efficiency.

2. Second Embodiment

(1) Device Configuration

Figure 16:
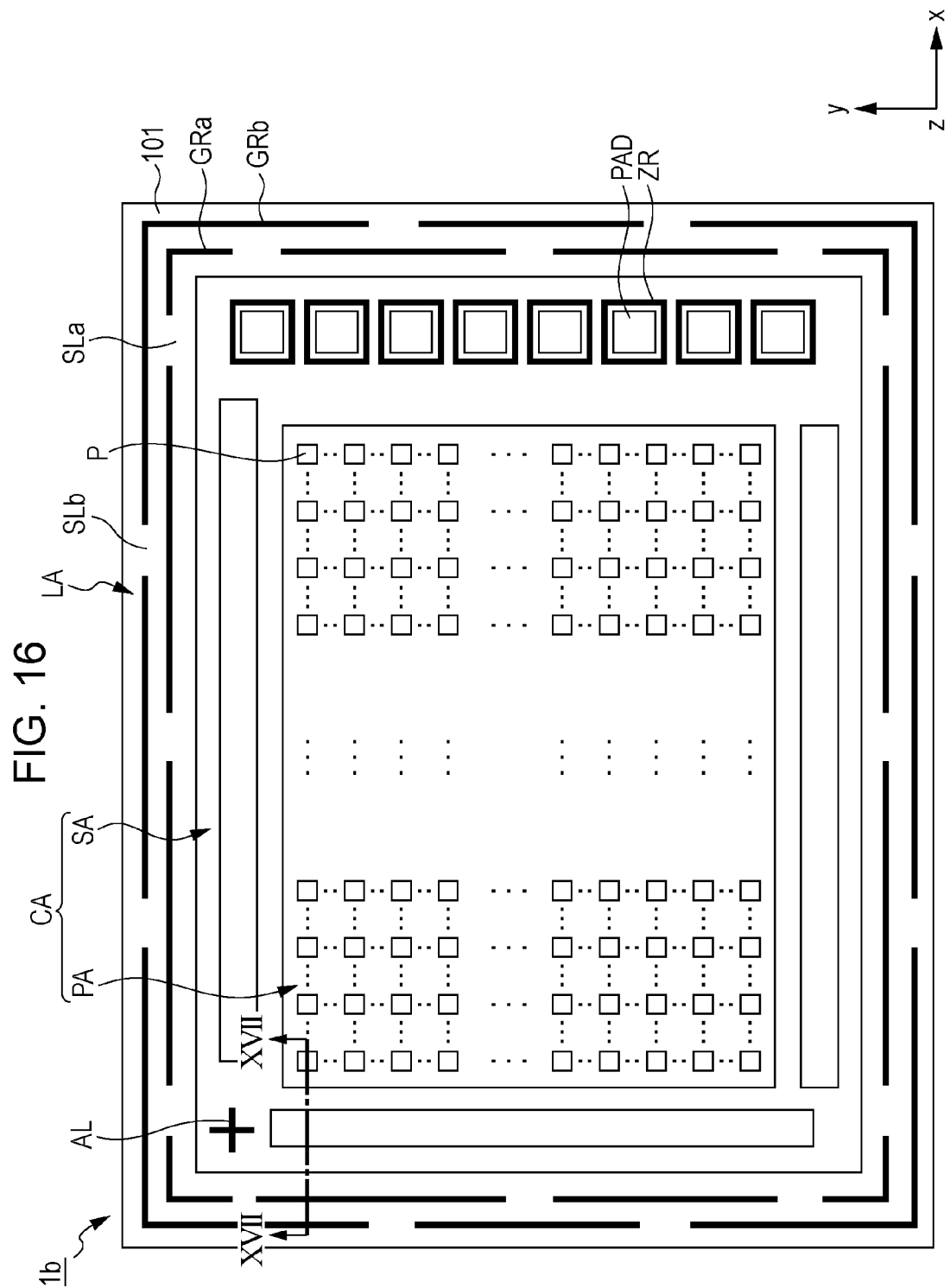
FIG. 16 is a diagram illustrating main elements of a solid-state imaging device according to a second embodiment of the invention.
Figure 17:
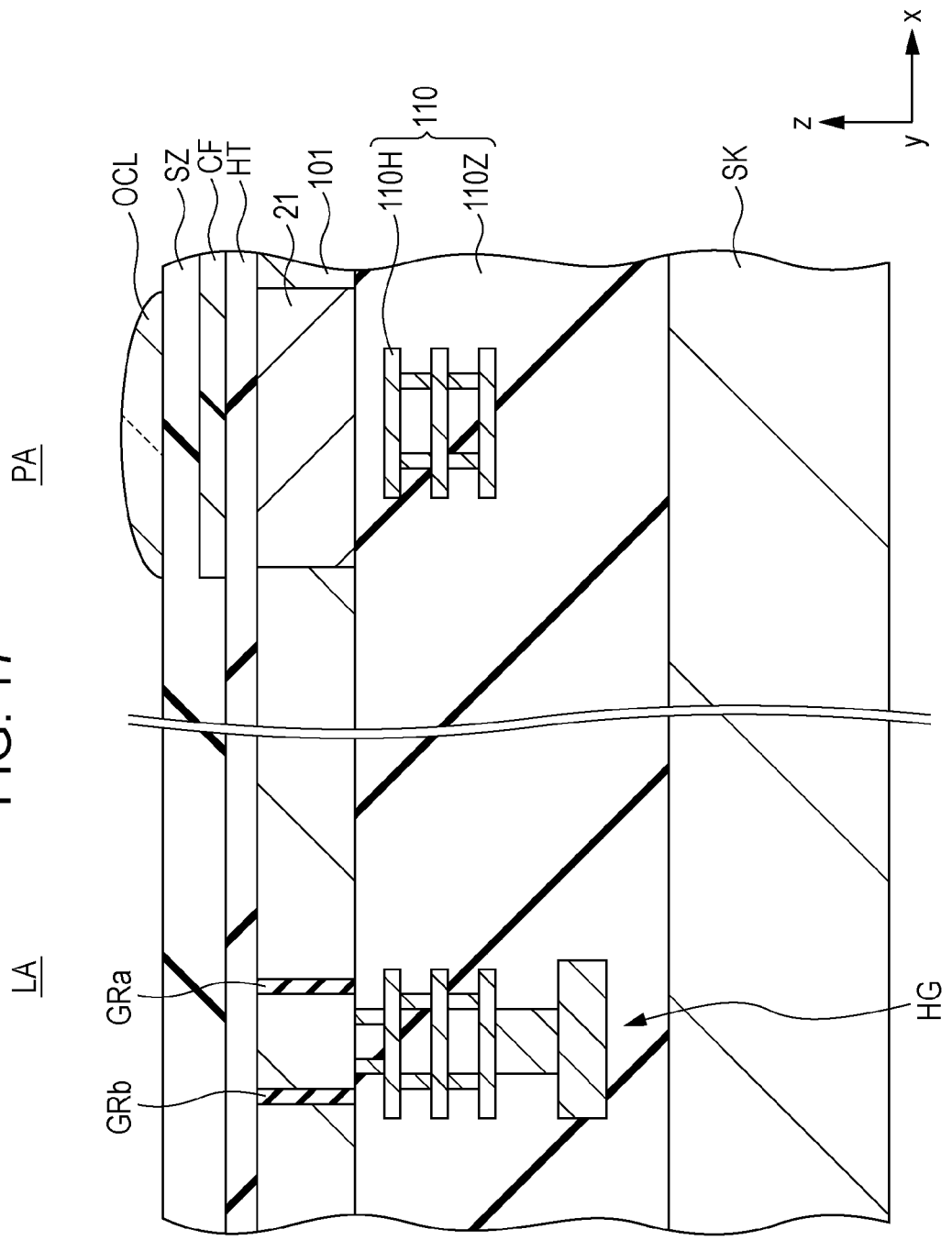
FIG. 17 is a diagram illustrating main elements of a solid-state imaging device according to a second embodiment of the invention.

FIGS. 16 and 17 illustrate main elements of the solid-state imaging device lb according to a second embodiment of the present invention.

Here, similarly to FIG. 2, FIG. 16 is a top plan view illustrating the overall configuration of the solid-state imaging device lb. Similar to FIG. 3, FIG. 17 illustrates a cross-section taken along the line XVII-XVII of FIG. 16.

Referring to FIGS. 16 and 17, the present embodiment differs from the first embodiment in that a plurality of guard ring structures are provided. For example, FIGS. 16 and 17 illustrate an embodiment, which includes a first guard ring structure and a second guard ring structure. The first guard ring structure includes guard ring GRa and at least one slit SLa (e.g., at least one portion comprised of the substrate). The second guard ring structure includes guard ring GRb and at least one slit SLb (e.g., at least one portion comprised of the substrate). The present embodiment is similar to the first embodiment except, for example, on this point. Therefore, a description of similar elements will be omitted.

As shown in FIGS. 16 and 17, the guard rings GRa and GRb are provided in the scribe area LA. The guard rings GRa and GRb are provided to pass through the semiconductor substrate 101 between the surface and the rear surface of the semiconductor substrate 101.

However, in the present embodiment, unlike the first embodiment, first and second guard rings GRa and GRb are provided in the scribe area LA.

Each of the first and second guard rings GRa and GRb is provided to surround the circumference of the chip area CA in a rectangular shape in the inner side of the chip area CA side than the end divided through the dicing in the scribe area LA as shown in FIG. 16.

Each of the first and second guard rings GRa and GRb is provided in a part of the slits SLa and SLb as shown in FIG. 16.

Each of the first and second guard rings GRa and GRb is provided to pass through the semiconductor substrate 101 between the surface and the rear surface of the semiconductor substrate 101 as shown in FIG. 17.

Here, similar to the guard ring GR of the first embodiment, the first guard ring GRa is formed of a material having properties (such as hardness or rigidity) different from those of the semiconductor substrate 101.

Specifically, as shown in FIG. 16, the first guard ring GRa includes a portion extending in the X-direction. In addition, in the portion extending in the X-direction, the slits SLa are provided in the portion located in the center of the chip area CA and the portions located in both ends in the X-direction. In addition, the first guard ring GRa includes the portion extending in the Y-direction. In the portion extending in the Y-direction, the slits SLa are provided in the portion located in the center of the chip area CA and the portions located in both ends in the Y-direction.

The second guard ring GRb is provided in the outer side of the first guard ring GRa around the first guard ring GRa in the rectangular shape as shown in FIG. 16. In addition, similar to the first guard ring GRa, the second guard ring GRb is formed of a material having properties (such as hardness or rigidity) different from those of the semiconductor substrate 101.

Specifically, similar to the first guard ring GRa, the second guard ring GRb includes the portion extending in the X-direction. However, the slits SLb of the second guard ring GRb formed in the portion extending in the X-direction are provided in different positions from those of the slits SLa of the first guard ring GRa formed in the portion extending in the X-direction. Here, the slits SLb of the second guard ring GRb are provided in the locations between a plurality of slits SLa arranged in the X-direction in the portion extending in the X-direction of the first guard ring GRa.

Similar to the first guard ring GRa, the second guard ring GRb includes the portion extending in the Y-direction. However, the slits SLb of the second guard ring GRb formed in the portion extending in the Y-direction are provided in different positions from those of the slits SLa of the first guard ring GRa formed in the portion extending in the Y-direction. Here, the silts SLb of the second guard ring GRb are formed in the positions between a plurality of slits SLa arranged in the Y-direction in the portion extending in the Y-direction of the first guard ring GRa.

As discussed above and shown in FIG. 16, slit SLa of the first guard ring structure overlaps a part corresponding to the second guard ring GRb along an axis that is perpendicular to the first guard ring structure and the second guard ring structure. Meanwhile, slit SLb of the second guard ring structure overlaps a part corresponding to the first guard ring GRa along an axis that is perpendicular to the first guard ring structure and the second guard ring structure. As shown in FIG. 16, a portion of guard ring GRa may overlap a corresponding portion of guard ring GRb along an axis that is perpendicular to the first guard ring structure and the second guard ring structure.

Each of the aforementioned first and second guard rings GRa and GRb is formed through the same process as the process of forming the guard ring GR (Process 1) of the first embodiment.

That is, in the scribe area LA, the trench TR is formed in the portion forming the first and second guard rings GRa and GRb. Then, for example, after a film is formed to bury an insulating material such as silicon oxide ($SiO_2$) inside the trench TR, a CMP process or the like is performed so as to form the first and second guard rings GRa and GRb.

Similar to the first embodiment, after the processes 2 to 6, dicing is performed using a blade (not shown) in the scribe area LA provided in the line shape around a plurality of the solid-state imaging devices 1 so that the semiconductor substrate 101 is divided into a plurality of solid-state imaging devices 1*b*.

(2) Conclusion

Similar to the first embodiment, in the present embodiment, the slits SLa and SLb are provided in the guard rings GRa and GRb as described above. For this reason, the electric charges accumulated in the inner portion surrounded by the guard rings GRa and GRb can be evacuated from the inner portion to the outer portion through the slits SLa and SLb (refer to FIG. 17). Slits SLa and SLb (e.g., portions comprised of substrate) are structured to allow electric charge to migrate past the guard ring.

Here, a plurality of guard rings GRa and GRb are provided in the scribe area LA. Specifically, the first guard ring GRa is provided in the chip area CA side of the scribe area LA. In addition, the second guard ring GRb is provided in the location separated from the chip area CA further than the first guard ring GRa in the scribe area LA (refer to FIG. 17).

Each of the first and second guard rings GRa and GRb includes an extending portion extending along the line diced in the scribe area LA. Such an extending portion is provided in different positions in the slits SLa and SLb of the first and second guard rings GRa and GRb (refer to FIG. 17).

For this reason, in the slits SLb of the second guard ring GRb, the first guard ring GRa can be used to stop chipping propagating from the scribe area LA to the chip area CA.

Therefore, in the present embodiment, since it is possible to preferably prevent chipping from propagating from the scribe area LA to the chip area CA, it is possible to improve product yield and obtain a high manufacturing efficiency.

3. Third Embodiment (1) Device Configuration

Figure 18:
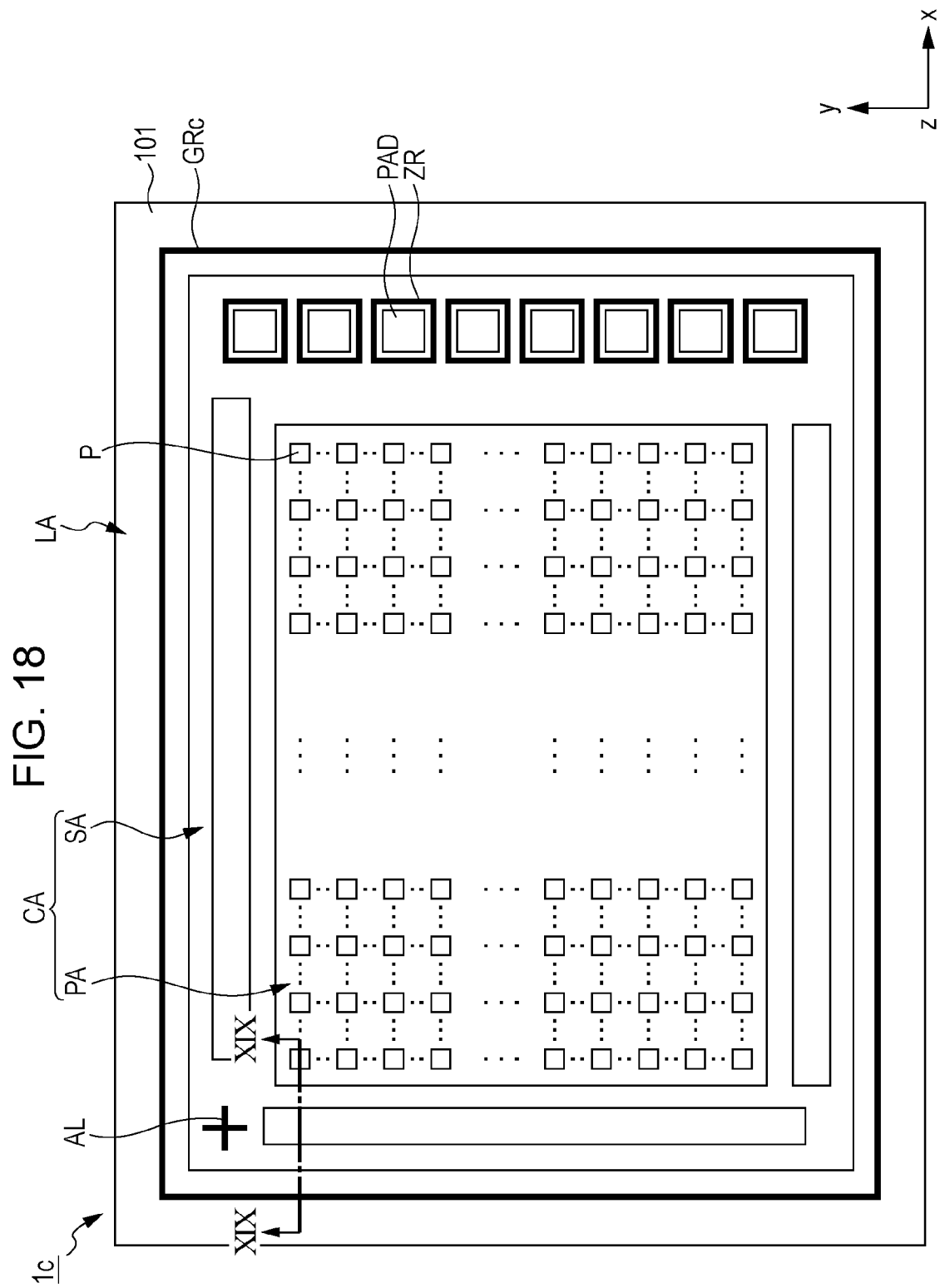
FIG. 18 is a diagram illustrating main elements of a solid-state imaging device according to a third embodiment of the invention.
Figure 19:
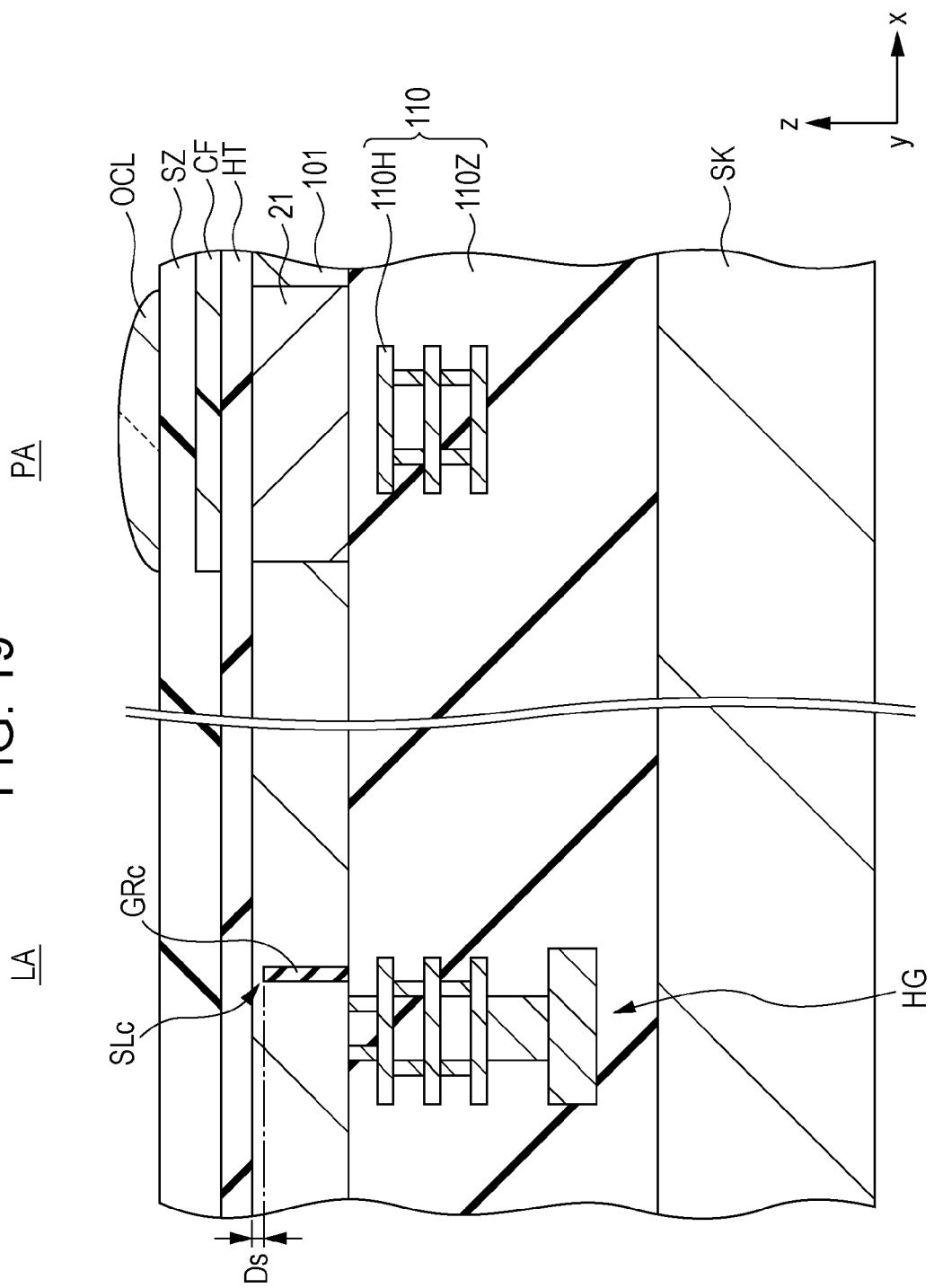
FIG. 19 is a diagram illustrating main elements of a solid-state imaging device according to a third embodiment of the invention.

FIGS. 18 and 19 illustrate elements of the solid-state imaging device 1*c* according to the third embodiment of the present invention.

Similar to FIG. 2, FIG. 18 is a top plan view illustrating an overall configuration of the solid-state imaging device 1c. Similar to FIG. 3, FIG. 19 illustrates a cross-section taken along the line XIV-XIV of FIG. 18.

Referring to FIGS. 18 and 19, the present embodiment differs from the first embodiment in the positions of the slits SLc of the guard ring GRc. The present embodiment is similar to the first embodiment except on this point. Therefore, a description of the repeated elements will be omitted.

As shown in FIGS. 18 and 19, the guard ring GRc is provided in the scribe area LA.

The guard ring GRc is provided to surround the circumference of the chip area CA in a rectangular shape in the inner side of the chip area CA side than the end divided through the dicing in the scribe area LA as shown in FIG. 18.

However, in the present embodiment, as shown in FIG. 18, the slit is not provided in the guard ring GRc on the surface along the main surface (X-Y surface) of the semiconductor substrate 101. As shown in FIG. 19, the slit SLc is provided in the guard ring GRc on the cross-section of the semiconductor substrate 101 (X-Z surface or Y-Z surface).

Specifically, as shown in FIG. 19, the guard ring GRc does not pass through the semiconductor substrate 101 between the surface and the rear surface of the semiconductor substrate 101. As such, a thickness of the guard ring GRc is less than a thickness of the semiconductor substrate 101. In the guard ring GRc, the slit SLc is formed in the portion of the surface side including the portion from the rear surface (lower surface) to a position in the middle of depth to the surface (upper surface) of the semiconductor substrate 101.

Here, similar to the guard ring GR of the first embodiment, the guard ring GRc is formed of a material having properties (such as hardness or rigidity) different from those of the semiconductor substrate 101.

Specifically, as shown in FIG. 18, the guard ring GRc includes the portion extending in the X-direction. In addition, the guard ring GRc includes the portion extending in the Y-direction. The slits SLc are formed in both the portion extending in the X-direction and the portion extending in the Y-direction as shown in FIG. 19. That is, similar to the guard ring GRc, the slits SLc are provided to surround the circumference of the chip area CA in the rectangular shape.

The aforementioned guard ring GRc is formed through the same process as the process of forming the guard ring GR (process 1) of the first embodiment.

That is, in the scribe area LA, the trench is formed in the portion forming the guard ring GRc. It is noted that the trench is shallower in depth than that of the first embodiment. Then, for example, a film is formed to bury an insulating material such as silicon oxide ($SiO_2$) in the inner portion of the trench TR, and then, a CMP process or the like is performed so as to form the guard ring GRc.

Similar to the first embodiment, after each process (processes 2 to 6), dicing is performed using a blade (not shown) in the scribe area LA provided in the line shape around a plurality of the solid-state imaging devices 1 so that the semiconductor substrate 101 is divided into a plurality of solid-state imaging devices 1c.

Furthermore, while the slits SLc are provided to surround the circumference of the chip area CA in the rectangular shape in the present embodiment, the invention is not limited thereto. Similar to the first embodiment, the slits SLc may be provided in the cross-sections of the portion located in the center of the chip area CA and the portions located in both ends in the X-direction for the portion extending in the X-direction of the guard ring GRc. Similar to the first embodiment, the slits SLc may be provided in the cross-sections of the portion located in the center of the chip area CA and the portions located in both ends in the Y-direction for the portion extending in the Y-direction of the guard ring GRc.

(2) Conclusion

As described above, in the present embodiment, similar to the first embodiment, the slits SLc are provided in the guard ring GRc. For this reason, the electric charges accumulated in the inner portion surrounded by the guard ring GRc are evacuated from the inner portion to the outer portion through the slits SLc (refer to FIG. 17).

Here, the guard ring GRc includes the portion extending from one surface to a position in the middle of the depth to the other surface in the depth direction (Z-direction) of the semiconductor substrate 101. In addition, the slits SLc are provided between a position in the middle of the depth to the other surface and the other surface in the depth direction (Z-direction) of the semiconductor substrate 101.

Therefore, in the present embodiment, it is possible to preferably prevent chipping from propagating from the scribe area LA to the chip area CA. Therefore, it is possible to improve product yield and obtain a high manufacturing efficiency.

4. Others

The invention may be embodied in various modifications without being limited to the aforementioned embodiments.

While four transistors including the transmission transistor, the amplification transistor, the selection transistor, and the reset transistor are provided and described, as the pixel transistor in the aforementioned embodiments, the invention is not limited thereto. For example, three transistors including transmission transistor, the amplification transistor, and the reset transistor may be provided as the pixel transistor.

While a single transmission transistor, a single amplification transistor, a single selection transistor, and a single reset transistor are provided for a single photodiode in the aforementioned embodiments, the invention is not limited thereto. For example, a single amplification transistor, a single selection transistor, and a single reset transistor may be provided for a plurality of photodiodes.

While the invention is applied to a camera in the aforementioned embodiments, the invention is not limited thereto. The invention may be applied to other electronic apparatuses having a solid-state imaging device such as a scanner or a copy machine.

While the silicon substrate is used as the semiconductor substrate to manufacture the solid-state imaging device in the aforementioned embodiments, the invention is not limited thereto. The invention may be applied to the case where the solid-state imaging device is manufactured using a so-called SOI substrate.

Specifically, first, an SOI substrate having a semiconductor layer (not shown) made of single crystal silicon and a silicon oxide film (BOX layer) (not shown) is provided on one surface of the silicon substrate (not shown). Then, each element including the guard ring or the photodiode is formed on the surface of the semiconductor layer (not shown) of the SOI substrate through the same process as those of aforementioned processes 1 and 2. By performing the processes 3 and 4 described above, the interconnect layer and the support substrate are provided on the surface of the semiconductor layer (not shown) which is an SOI substrate. Then, similar to the process 5 described above, the semiconductor substrate (not shown) of the SOI substrate and the silicon oxide film (not shown) are sequentially removed. Then, similar to the process 6 described above, after elements such as the color filter and the on-chip lens are formed, dicing is performed to divide the semiconductor substrate into the solid-state imaging devices. That is, in this case, the semiconductor layer (not shown) of the SOI substrate corresponds to the semiconductor layer of the present invention.

While the guard ring, the alignment mark, and the insulation ring are simultaneously formed through the same process in the aforementioned embodiments, the invention is not limited thereto. Each part may be separately formed.

While one or two guard rings are provided in the scribe area in the aforementioned embodiments, the invention is not limited thereto. Three or more guard rings may be provided in the scribe area as appropriate.

While the portion where the alignment mark is provided is planarized in accordance with the surface of the semiconductor substrate in the aforementioned embodiments, the invention is not limited thereto. The alignment mark may be configured to protrude in a convex shape from the semiconductor substrate. As a result, since the alignment mark can be readily distinguished, it is possible to more appropriately perform positioning.

While the guard ring provided in the semiconductor substrate and the guard ring within the interconnect layer are located in the same position in the surface direction of the semiconductor substrate in the aforementioned embodiments, the invention is not limited thereto. The guard ring provided in the semiconductor substrate and the guard ring within the interconnect layer may be located in different positions.

While the rear illuminated type CMOS image sensor is used as the solid-state imaging device in the aforementioned embodiments, the invention is not limited thereto. The invention may be applied to a "surface illumination type" in which the photodiode receives the light incident from the surface of the interconnect layer side. The invention may be applied to the CCD image sensor in addition to the CMOS image sensor as necessary. Moreover, the invention may be applied to various semiconductor devices without being limited to a solid-state imaging device.

In the aforementioned embodiments, the solid-state imaging device 1, 1b, and 1c correspond to the solid-state imaging device or the semiconductor device of the invention. In the aforementioned embodiments, the photodiode 21 corresponds to the photoelectric converter unit. In the aforementioned embodiments, the camera 40 corresponds to the electronic apparatus of the invention. In the aforementioned embodiments, the semiconductor substrate 101 corresponds to the semiconductor substrate of the invention. In the aforementioned embodiments, the interconnect layer 110 corresponds to the interconnect layer of the invention. In the aforementioned embodiments, the alignment mark AL corresponds to the alignment mark of the invention. In the aforementioned embodiments, the chip area CA corresponds to the chip area of the invention. In the aforementioned embodiments, the guard rings GR, GRa, GRb, and GRc correspond to the guard ring of the invention. In the aforementioned embodiments, the pad opening area KR corresponds to the pad opening area of the invention. In the aforementioned embodiments, the scribe area LA corresponds to the scribe area of the invention. In the aforementioned embodiments, the pixel P corresponds to the pixel of the invention. In the aforementioned embodiments, the pixel area PA corresponds to the pixel area of the invention. In the aforementioned embodiments, the slits SL, SLa, SLb, and SLc correspond to the slits of the invention. In the aforementioned embodiments, the insulation ring ZR corresponds to the insulation ring of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a substrate;
   a pixel region on the substrate, the pixel region including a plurality of pixels, each pixel having a photoelectric conversion unit; and
   at least one guard ring structure provided around the pixel region, the guard ring structure including a guard ring and at least one portion comprised of the substrate.

2. The solid-state imaging device of claim 1, wherein the at least one portion comprised of the substrate is structured to allow electric charge to migrate past the guard ring.

3. The solid-state imaging device of claim 1, wherein the guard ring extends through the entire substrate in a thickness direction.

4. The solid-state imaging device of claim 1, wherein a thickness of the guard ring is less than a thickness of the substrate.

5. The solid-state imaging device of claim 1, wherein a material of the guard ring is different than a material of the substrate.

6. The solid-state imaging device of claim 1, wherein the guard ring comprises at least one insulating material.

7. The solid-state imaging device of claim 1, wherein the guard ring is configured to be a trench, and the trench includes air.

8. The solid-state imaging device of claim 1, further comprising a photodiode formed within the substrate at the pixel region.

9. The solid-state imaging device of claim 1, wherein the at least one portion comprised of the substrate is configured to be a slit.

10. The solid-state imaging device of claim 1, further comprising:
    an interconnect layer; and
    a guard ring structure provided in the interconnect layer, wherein,
       a material of a guard ring of the guard ring structure in the interconnect layer is different than a material of the interconnect layer.

11. The solid-state imaging device of claim 1, wherein the at least one guard ring structure includes:
    (a) a first guard ring structure including a first guard ring and at least one portion comprised of the substrate, and
    (b) a second guard ring structure including a second guard ring and at least one portion comprised of the substrate.

12. The solid-state imaging device of claim 11, wherein:
    the at least one portion comprised of the substrate of the first guard ring structure overlaps a part corresponding to the second guard ring along an axis that is perpendicular to the first guard ring structure and the second guard ring structure.

13. The solid-state imaging device of claim 1, wherein the solid-state imaging device is a backside illuminated type device.

14. An electronic apparatus comprising:
a solid-state imaging device which includes
   (a) a substrate,
   (b) a pixel region on the substrate, the pixel region including a plurality of pixels, each pixel having a photoelectric conversion unit, and
   (c) at least one guard ring structure provided around the pixel region, the guard ring structure including a guard ring and at least one portion comprised of the substrate.

15. A semiconductor device comprising:
a substrate;
a region including a semiconductor element on the substrate; and
at least one guard ring structure provided around the region, the at least one guard ring structure including a guard ring and at least one portion comprised of the substrate.

16. A method for manufacturing a solid-state imaging device, said method comprising:
forming at least one guard ring structure by (a) forming at least one trench in a portion of a substrate where a guard ring is to be formed, and (b) filling the trench with a material to form the guard ring, the material of the guard ring being different from a material of the substrate, and
dicing the substrate around the at least one guard ring structure,
wherein,
   at the time of dicing, the at least one guard ring structure includes the guard ring and at least one portion comprised of the substrate.

17. The method of claim 16, further comprising:
forming an alignment mark by (a) forming at least one trench in a portion of the substrate where the alignment mark is to be formed and (b) filling the trench of the alignment mark with a material to form the alignment mark,
wherein,
   the alignment mark and the at least one guard ring structure are formed at the same time.

18. The method of claim 16, further comprising:
forming an interconnect layer on one side of the substrate; and
forming a guard ring structure in the interconnect layer,
wherein,
   a material of a guard ring of the guard ring structure in the interconnect layer is different than a material of the interconnect layer.

19. The method of claim 16, further comprising:
planarizing a surface of the substrate to expose the guard ring.

20. The method of claim 16, further comprising:
planarizing a surface of the substrate,
wherein,
   a thickness of the planarized substrate is greater than a thickness of the guard ring.

21. The method of claim 16, further comprising forming a photodiode within the substrate at a pixel region.

22. The method of claim 16, wherein the solid-state imaging device is a backside illuminated type device.

* * * * *